(12) United States Patent
Chang et al.

(10) Patent No.: US 7,220,611 B2
(45) Date of Patent: May 22, 2007

(54) LIQUID CRYSTAL DISPLAY PANEL AND FABRICATING METHOD THEREOF

(75) Inventors: Youn-Gyoung Chang, Kyounggi-do (KR); Seung-Hee Nam, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 153 days.

(21) Appl. No.: 10/962,544

(22) Filed: Oct. 13, 2004

(65) Prior Publication Data
US 2005/0077517 A1   Apr. 14, 2005

(30) Foreign Application Priority Data
Oct. 14, 2003 (KR) ............... 10-2003-0071392
Oct. 14, 2003 (KR) ............... 10-2003-0071394

(51) Int. Cl.
*H01L 21/00* (2006.01)
(52) U.S. Cl. ............... 438/30; 438/33; 438/34; 257/59; 257/60; 257/72; 257/89; 257/E29.151
(58) Field of Classification Search ............... None
See application file for complete search history.

(56) References Cited

U.S. PATENT DOCUMENTS

| | | | | |
|---|---|---|---|---|
| 6,897,099 B2* | 5/2005 | Yoo et al. | ............... | 438/149 |
| 7,132,689 B2* | 11/2006 | Ahn et al. | ............... | 257/72 |
| 2002/0187575 A1* | 12/2002 | Maruyama et al. | ............... | 438/33 |
| 2003/0234424 A1* | 12/2003 | Suzawa et al. | ............... | 257/347 |
| 2004/0017520 A1* | 1/2004 | Yoo et al. | ............... | 349/43 |
| 2004/0171200 A1* | 9/2004 | Maeda et al. | ............... | 438/149 |
| 2004/0195574 A1* | 10/2004 | Ahn et al. | ............... | 257/72 |
| 2005/0078264 A1* | 4/2005 | Yoo et al. | ............... | 349/152 |
| 2005/0186718 A1* | 8/2005 | Yoo et al. | ............... | 438/151 |

FOREIGN PATENT DOCUMENTS

| | | |
|---|---|---|
| JP | 06-095146 | 4/1994 |
| JP | 06-308529 | 11/1994 |
| JP | 2000-002886 | 1/2000 |
| JP | 2001-154221 | 6/2001 |
| KR | 2003-0016014 | 2/2003 |

* cited by examiner

*Primary Examiner*—Evan Pert
*Assistant Examiner*—Victor A. Mandala, Jr.
(74) *Attorney, Agent, or Firm*—Morgan, Lewis & Bockius

(57) ABSTRACT

A liquid crystal display panel including a thin film transistor array substrate structure including, a substrate, a gate line and a data line disposed on the substrate and insulated from each other by a gate insulating pattern, a thin film transistor provided at intersection of the gate and data lines, a protective film disposed to protect the thin film transistor, and a pad structure connected to a respective one of the gate line and data line, the pad structure including a transparent conductive film and a data metal layer; and a color filter array substrate structure joined with the thin film transistor array substrate structure, wherein the protective film is disposed within an area where the color filter array substrate structure overlaps with the thin film transistor array substrate structure, and exposing either the data metal layer or the transparent conductive film along a side portion of the substrate.

36 Claims, 42 Drawing Sheets

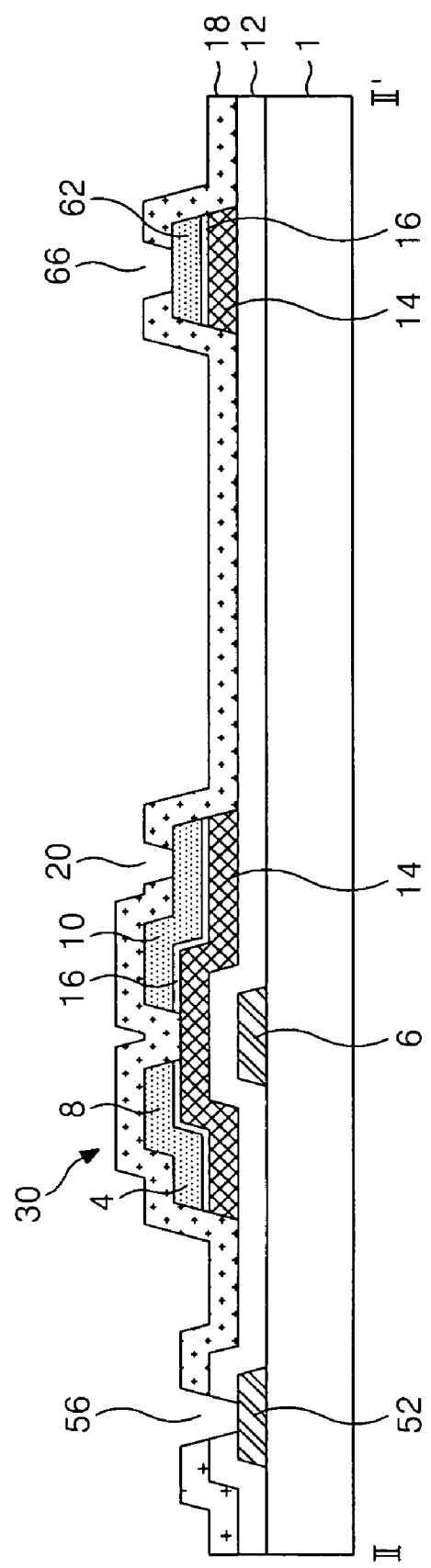

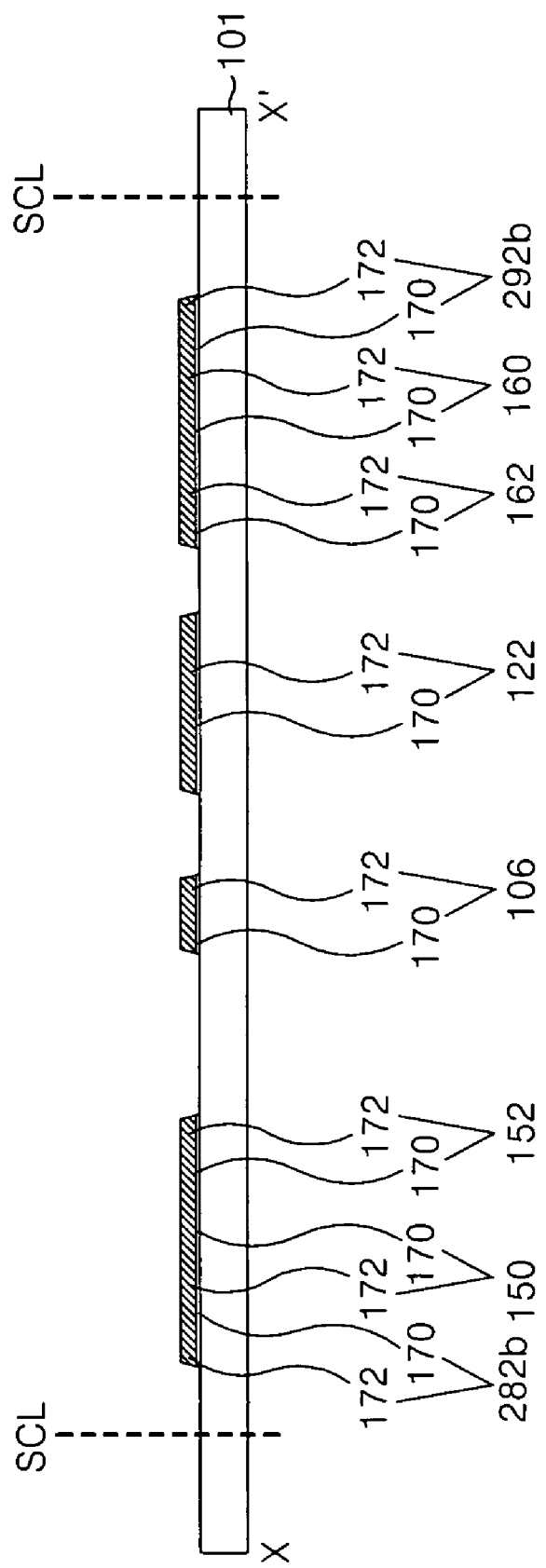

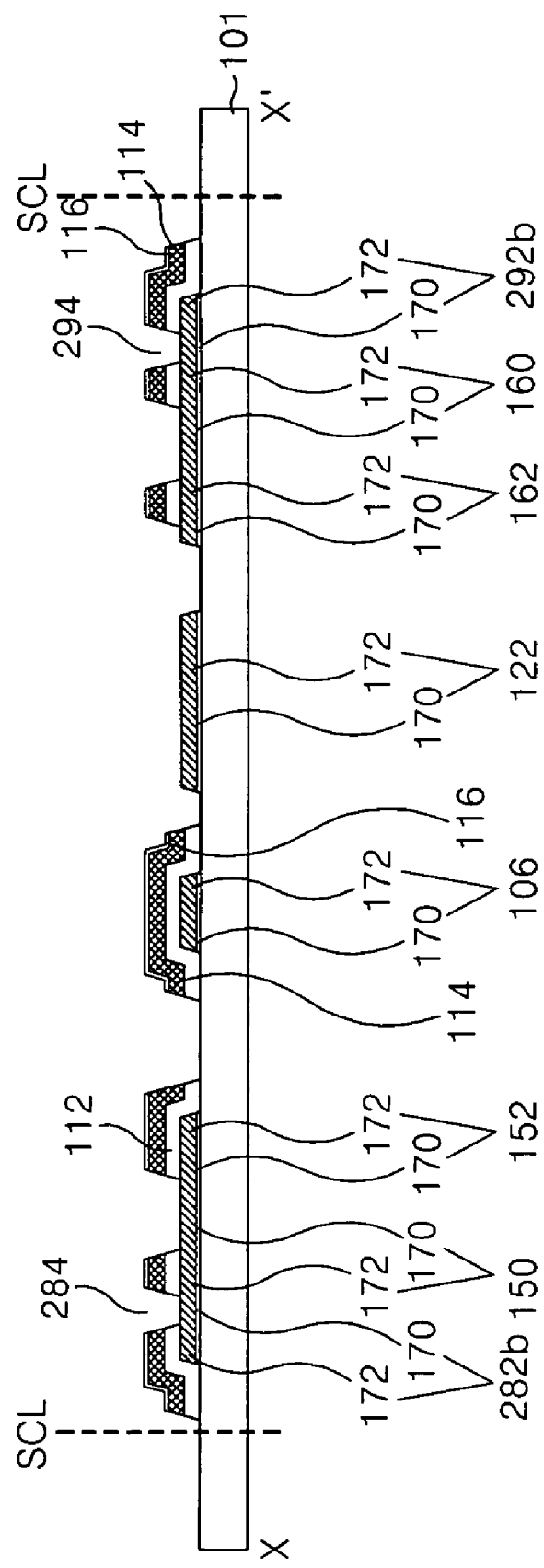

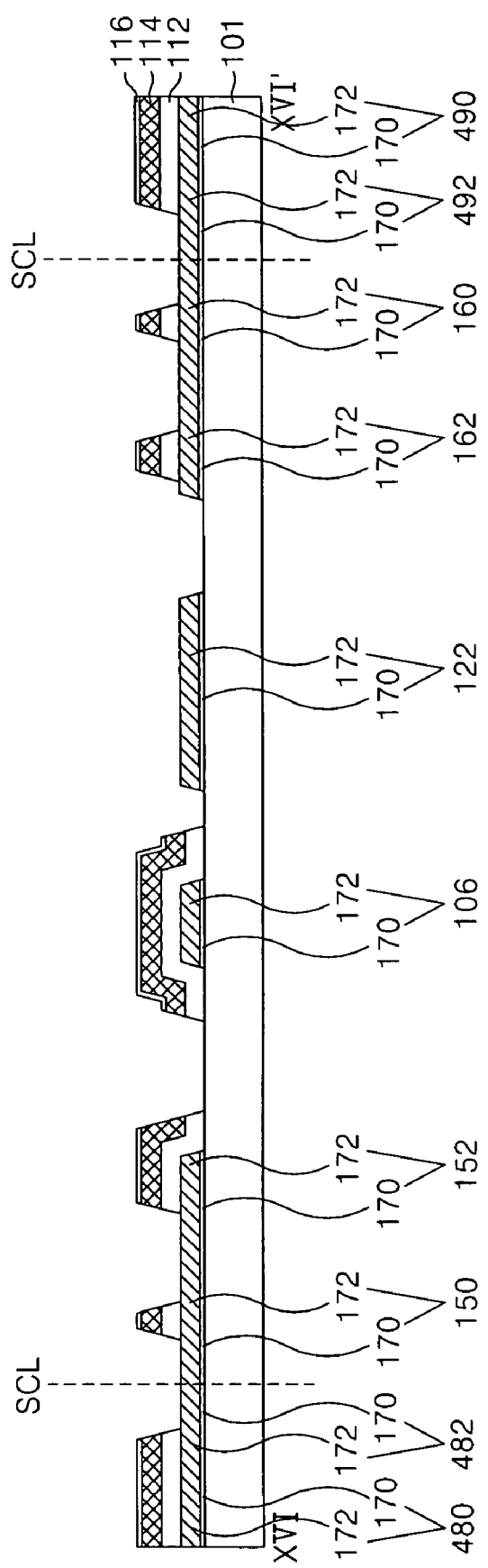

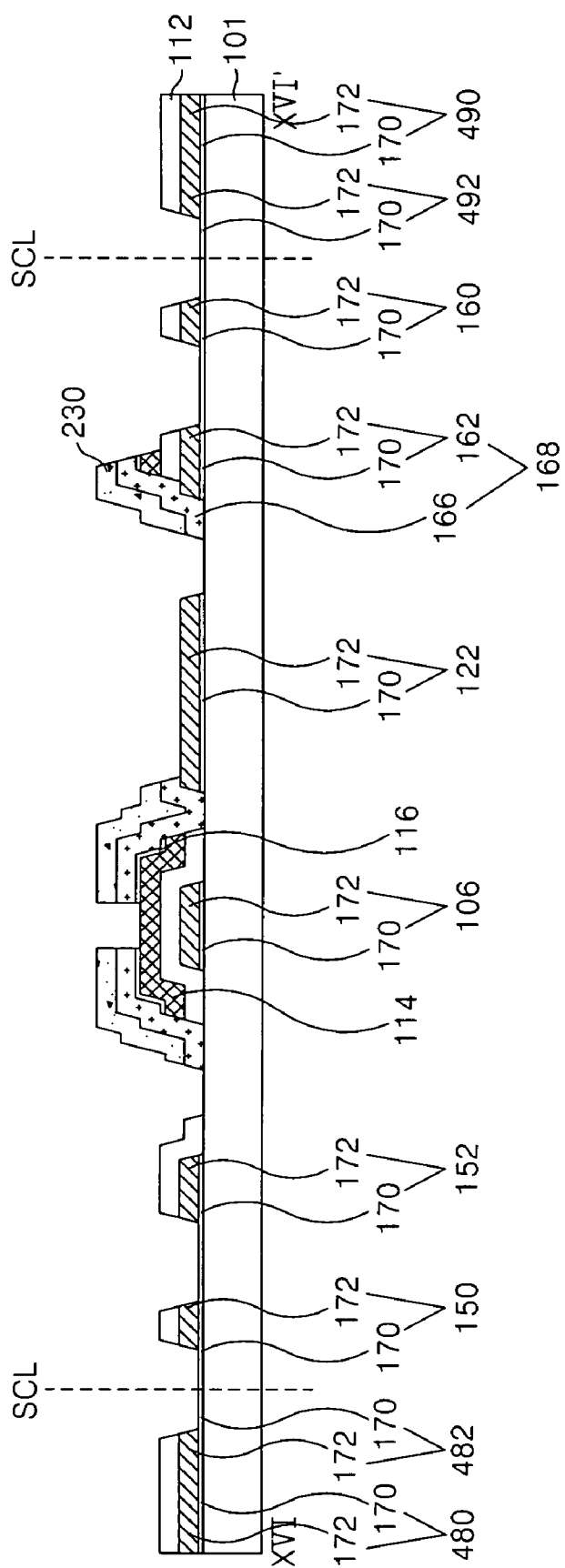

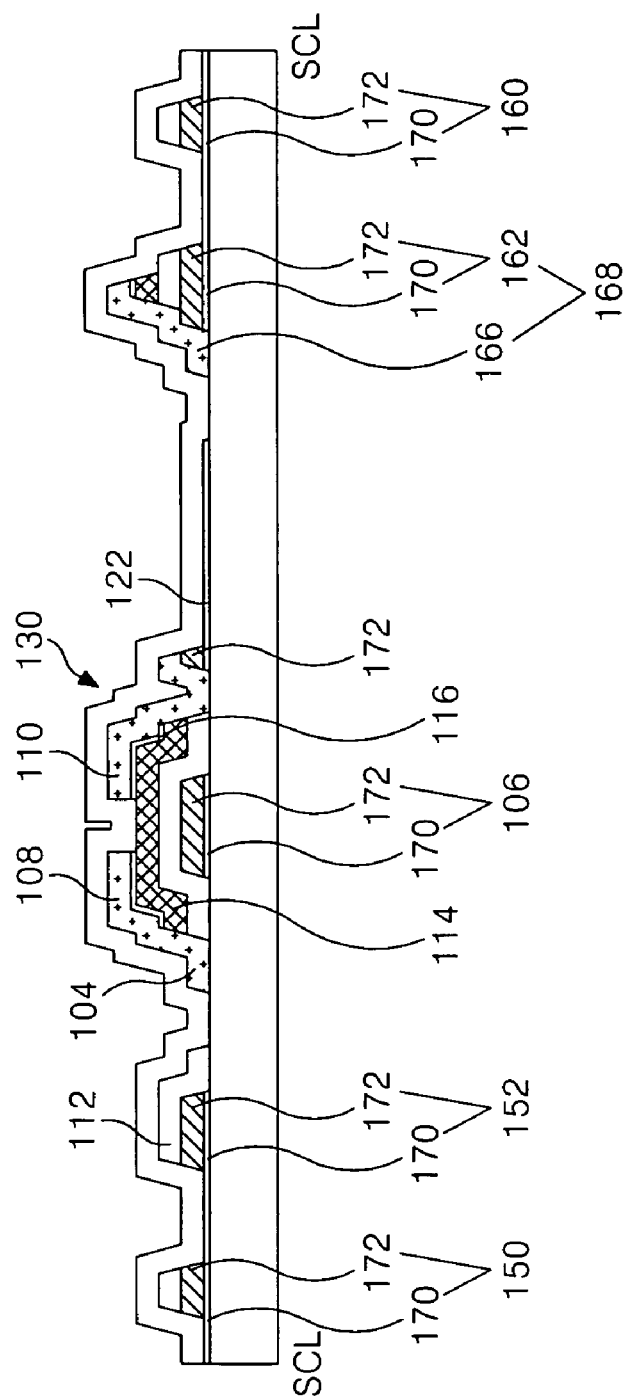

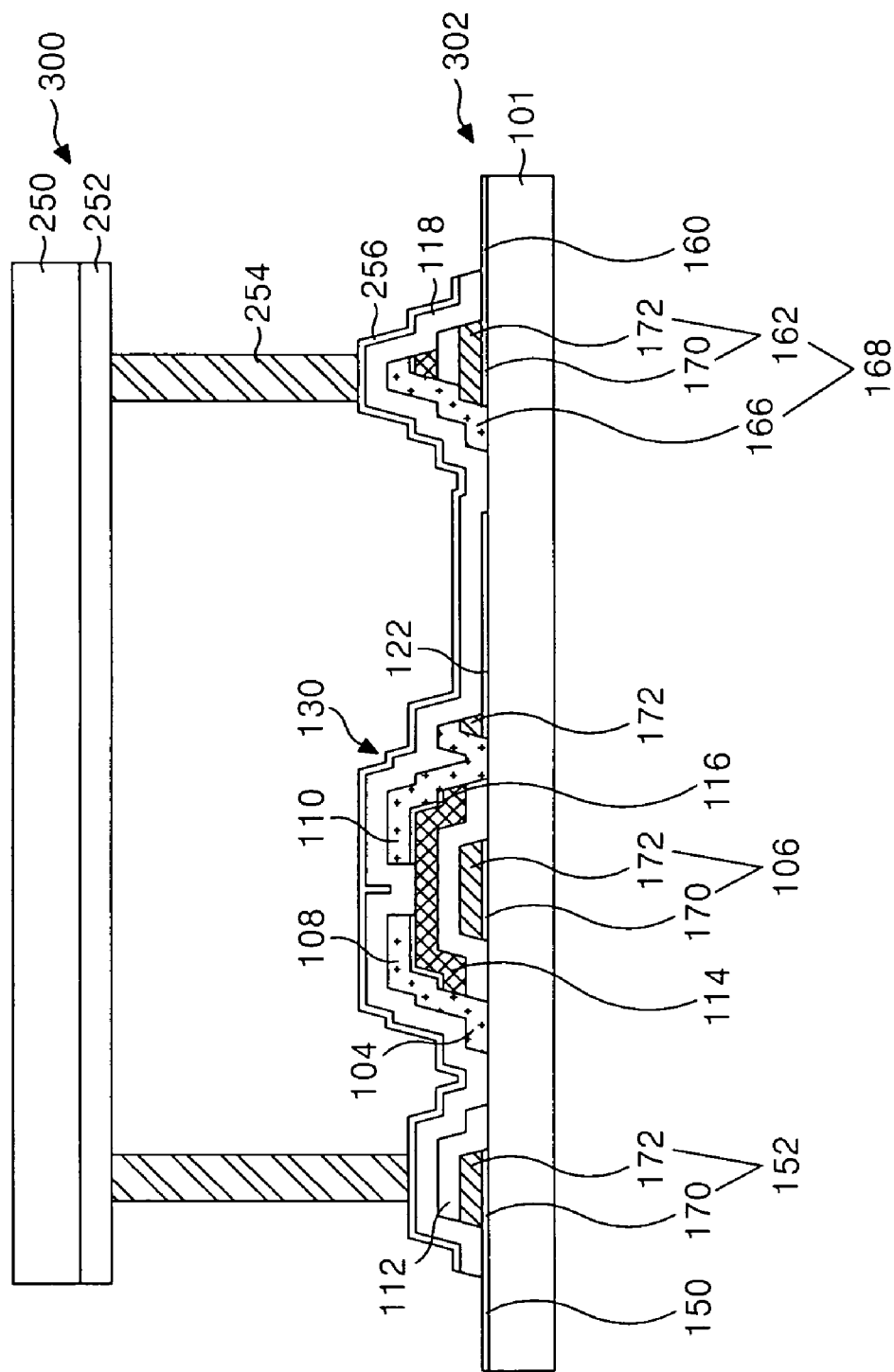

LIQUID CRYSTAL DISPLAY PANEL AND FABRICATING METHOD THEREOF

This application claims the benefit of Korean Patent Application Nos. 2003-0071392 filed in Korea on Oct. 14, 2003, and 2003-0071394 filed in Korea on Oct. 14, 2003, which are hereby incorporated by reference.

BACKGROUND OF THE INVENTION

1. Field of the Invention

This invention relates to a liquid crystal display, and more particularly, to a liquid crystal display panel and a fabricating method thereof for reducing the number of mask processes as well as preventing a corrosion of a shorting line.

2. Description of the Related Art

In general, a liquid crystal display (LCD) drives a liquid crystal by an electric field formed between a pixel electrode and a common electrode arranged opposite from each other on upper and lower substrates. The LCD controls the application of the electric field across a liquid crystal, and accordingly light transmittance of the liquid crystal, thereby displaying a desired picture.

The LCD includes a thin film transistor array substrate structure and a color filter array substrate that are joined opposite from each other, a spacer for constantly keeping a cell gap between the two substrates, and a liquid crystal filled in the cell gap. The thin film transistor substrate structure comprises of a plurality of signal wirings and thin film transistors, and an alignment film coated thereon for the aligning the liquid crystal. The color filter array substrate structure is comprised of a color filter for implementing a color, a black matrix for preventing a light leakage, and an alignment film coated thereon for alignment of the liquid crystal.

In such a LCD, the thin film transistor substrate structure has a complicated fabrication process involving a semiconductor process that requires a plurality of mask processes. These processes lead to a significantly increased in the manufacturing cost of the liquid crystal display panel. To solve this, a thin film transistor array substrate structure has been developed with a reduced number of mask processes. Since one mask process can accommodate several processes, such as thin film deposition, cleaning, photolithography, etching, photo-resist stripping, and inspection processes, etc., the total number of mask processes can be reduced. Recently, a four-round mask process, one less mask process from the existent five-round mask process is becoming a standard mask process of the thin film transistor.

FIG. 1 is a plan view illustrating a related art lower transistor array substrate adopting a four-round mask process, and FIG. 2 is a cross-sectional view of the thin film transistor array substrate structure taken along line II–II' of FIG. 1. Referring to FIGS. 1 and 2, the thin film transistor array substrate structure includes a gate line 2 and a data line 4 provided on a lower substrate 1 intersecting each other and having a gate insulating pattern 12 therebetween. The gate line 2 is provided to apply a gate signal and the data line 4 is provided to a data signal at an intersection structure to define a pixel area 5. Furthermore, the thin film transistor array substrate includes a thin film transistor 30 provided at each intersection, a pixel electrode 22 provided at a cell area defined by an intersection, a gate pad 50 connected to the gate line 2, and a data pad 60 connected to the data line 4.

The thin film transistor 30 includes a gate electrode 6 connected to the gate line 2, a source electrode 8 connected to the data line 4, and a drain electrode 10 connected to the pixel electrode 22. The thin film transistor 30 allows a pixel signal on the data line 4 to be charged and maintained at the pixel electrode 22 in response to a gate signal from the gate line 2. Further, the thin film transistor 30 includes an active layer 14 overlapping the gate electrode 6 having a gate insulating pattern 12 therebetween to define a channel between the source electrode 8 and the drain electrode 10.

The active layer 14 also overlaps the data line 4 and a lower data pad electrode 62. On the active layer 14, an ohmic contract layer 16 is provided for making a contact with the data line 4, the source electrode 8, with the drain electrode 10 and the lower data pad electrode 62. The pixel electrode 22 is connected to the drain electrode 10 of the thin film transistor 30 via a first contact hole 20 passing through a protective film 18 and is provided at a pixel area 5.

Thus, an electric field is formed between the pixel electrode 22 to which a pixel signal is supplied via the thin film transistor 30 and a common electrode (not shown) supplied with a reference voltage. Liquid crystal molecules between the thin film transistor array substrate structure and the color filter array substrate structure rotates due to a dielectric anisotropy induced by such an electric field. Transmittance of a light onto the pixel area 5 is varied depending upon a rotation extent of the liquid crystal molecules, thereby implementing a gray level scale.

The gate pad 50 is connected to a gate driver (not shown) to apply a gate signal to the gate line 2. The gate pad 50 consists of a lower gate pad electrode 52 extended from the gate line 2, and an upper gate pad electrode 54 connected to the lower gate pad electrode 52 via a second contact hole 56 passing through the gate insulating pattern 12 and the protective film 18.

The data pad 60 is connected to a data driver (not shown) to apply a data signal to the data line 4. The data pad 60 comprises a lower data pad electrode 62 extended from the data line 4, and an upper data pad electrode 64 connected to an upper data pad electrode 64 connected to the lower data pad electrode 62 via a third contact hole 66 passing through the protective film 18.

Hereinafter, a method of fabricating the thin film transistor array substrate structure having the above-mentioned structure adopting the four-round mask process will be described in detail with reference to FIG. 3A to FIG. 3D. Referring to FIG. 3A, a first conductive pattern group including the gate line 2, the gate electrode 6, and the lower gate pad electrode 52 are provided on the lower substrate 1 by the first mask process. More specifically, a gate metal film is formed on the lower substrate 1 by a deposition technique such as sputtering. Then, the gate metal film is patterned by photolithography and etching process using a first mask to form the first conductive pattern group including the gate line 2, the gate electrode 6, and the lower gate pad electrode 52. The gate metal film is made from an aluminum group metal, and the like.

Referring to FIG. 3B, the gate insulating pattern 12 is coated over the lower substrate 1 provided with the first conductive pattern group. Further, semiconductor pattern including the active layer 14 and the ohmic contact layer 16; and a second conductive pattern group including the data line 4, the source electrode 8, the drain electrode 10, and the lower data pad electrode 62 are formed on the gate insulating pattern 12 by the second mask process.

More specifically, a plurality of layers are sequentially provided on the lower substrate 1. The gate insulating pattern 12, an amorphous silicon layer, a n⁺ amorphous silicon layer, and a data metal layer are sequentially disposed on the lower substrate 1 provided with the first conductive pattern group formed by the deposition techniques such as plasma enhanced chemical vapor deposition (PECVD) and the sputtering, etc. Herein, the gate insulating pattern 12 is formed from an inorganic insulating material such as silicon nitride ($SiN_x$) or silicon oxide ($SiO_x$). The data metal layer is selected from molybdenum (Mo), titanium (Ti), tantalum (Ta) or a molybdenum alloy, etc.

Then, a photo-resist pattern is formed on the data metal layer by photolithography using a second mask process. In this process, a diffractive exposure mask having a diffractive exposing part at a channel portion of the thin film transistor is used, thereby allowing a photo-resist pattern of the channel portion to have a lower height than other source/drain pattern portion. Subsequently, the source/drain metal layer is patterned by a wet etching process using the photo-resist pattern to provide the second conductive pattern group including the data line 4, the source electrode 8, and the drain electrode 10 which is integral to the source electrode 8.

Next, the $n^+$ amorphous silicon layer and the amorphous silicon layer are patterned simultaneously by a dry etching process using the same photo-resist pattern to provide the ohmic contact layer 16 and the active layer 14. The photo-resist pattern having a relatively low height is removed from the channel portion by the ashing process and thereafter the source/drain metal layer and the ohmic contact layer 16 of the channel portion are etched by the dry etching process. The active layer 14 of the channel portion is exposed to disconnect the source electrode 8 from the drain electrode 10. Then, the photo-resist pattern left on the second conductive pattern group is removed by the stripping process.

Referring to FIG. 3C, the protective film 18 including the first to third contact holes 20, 56 and 66 are formed on the gate insulating pattern 12 provided with the second conductive pattern group. The protective film 18 is entirely formed on the gate insulating pattern 12 by a deposition technique such as the plasma enhanced chemical vapor deposition (PECVD). Then, the protective film 18 is patterned by the photolithography and the etching process using a third mask to define the first to third contact holes 20, 56 and 66. The first contact hole 20 passes through the protective film 18 to expose the drain electrode 10, whereas the second contact hole 56 passes through the protective film 18 and the gate insulating pattern 12 to expose the lower gate pad electrode 52. The third contact hole 66 passes through the protective film 18 to expose the lower gate pad electrode 52. Herein, when a metal having a large dry etching ratio, such as molybdenum (Mo), is used as the data metal layer, the first and third contact holes 20 and 66 pass through the drain electrode 10 and the lower data pad electrode 62, respectively, to expose the side surfaces thereof. The protective film 18 is made from an inorganic insulating material identical to the gate insulating pattern 12, or an organic insulating material such as an acrylic organic compound having a small dielectric constant, BCB (benzocyclobutene) or PFCB (perfluorocyclobutane), etc.

Referring to FIG. 3D, the third conductive pattern group including the pixel electrode 22, the upper gate pad electrode 54, and the upper data pad electrode 64 are provided on the protective film 18 by the fourth mask process. More specifically, a transparent conductive film is coated onto the protective film 18 by a deposition technique such as the sputtering, etc. Then, the transparent conductive film is patterned by the photolithography and the etching process using a fourth mask to provide the third conductive pattern group including the pixel electrode 22, the upper gate pad electrode 54, and the upper data pad electrode 64. The pixel electrode 22 is electrically connected to the drain electrode 10 via the first contact hole 20. The upper gate pad electrode 54 is electrically connected to the lower gate pad electrode 52 via the second contact hole 56. The upper data pad electrode 64 is electrically connected to the lower data pad electrode 62, via the third contact hole 66. The transparent conductive film is formed from indium-tin-oxide (ITO), tin-oxide (TO), indium-tin-zinc-oxide (ITZO) or indium-zinc-oxide (IZO).

As described above, the related art thin film transistor array substrate structure and the fabricating method thereof adopts the four-round mask process, thereby reducing the total number of fabricating processes and hence reducing a manufacturing cost proportional to the fabrication with the five-round mask process. However, since the four-round mask process still has a complicate fabricating process to limit the cost reduction, there has been required a scheme capable of more simplifying the fabricating process to further reduce the manufacturing cost.

Furthermore, as shown in FIG. 4A, the thin film transistor array substrate structure of the related art liquid crystal display panel includes a gate shorting bar 80 connected to the gate pad 50 via a gate shorting line 82, and a data shorting bar 90 connected to the data pad 60 via a data shorting line 92. This feature is included to conduct a quality check to inspect a short and a breakage of the signal line after it was provided by the four-round mask process. As shown in FIG. 4B, when the lower substrate 1 is taken along the scribing line SCL (line crossing through the gate shorting line 82 and the data shorting line 92) after a poor performance of the liquid crystal display panel was detected by the shorting bars 80 and 90, then the gate shorting line 82 and the data shorting line 92 would have been exposed along the side surface of the lower substrate 1. In this case, a metal possessing a poor corrosion resistance, for example, the gate shorting line 82 formed from aluminum or copper, etc. becomes liable for a metal corrosion at a high temperature and in a humid environment. In addition, application of an electric field for driving of the TFT can cause the metal corrosion. These corrosion phenomenon can cause further problems such that the metal corrosion can extend into the gate pad 50 and the data pad 60 as well as the gate line 2 and the data line 4 when given sufficient time.

SUMMARY OF THE INVENTION

Accordingly, the present invention is directed to a liquid crystal display panel and a fabricating method thereof that substantially obviates one or more of the problems due to limitations and disadvantages of the related art.

An object of the present invention is to provide a liquid crystal display panel and a fabricating method thereof that is adaptive for preventing a corrosion of a shorting line when connecting a shorting bar to a pad.

Additional advantages of the invention will be set forth in the description which follows, and in part will become apparent from the description, or may be learnt by practice of the invention. These advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display panel including a thin film transistor array substrate structure including a substrate, a gate line and a data line disposed on the substrate and insulated from each other by a gate insulating pattern therebetween, a thin film transistor disposed at an intersection of the gate line and the data line, a protective film disposed to protect the thin film transistor, and a pad structure connected to a respective one of the gate line and data line, the pad structure including a transparent conductive film and a data metal layer, and a color filter array substrate structure joined with the thin film transistor array substrate structure, wherein the protective film is disposed within an area where the color filter array substrate structure overlaps with the thin film transistor array substrate structure so that either the data metal layer or the transparent conductive film is exposed along a side portion of the substrate.

In another aspect, a method of fabricating a liquid crystal display panel including the steps of forming a first conductive pattern group including a gate line, a gate electrode, a gate pad and a data pad each including a transparent conductive film, and a pixel electrode on a substrate, forming a semiconductor pattern and a gate insulating pattern on the substrate which is provided with the first conductive pattern group and the pixel electrode, forming a second conductive pattern group including a data line, a source electrode, and, a drain electrode on the substrate which is provided with the semiconductor pattern and the gate insulating pattern, forming a thin film transistor by the first conductive pattern group, the semiconductor pattern, gate insulating pattern, and the second conductive pattern group, providing a protective film on the substrate and the thin film transistor to protect the thin film transistor, forming an alignment film on the protective film at an area other than a pad area which includes the gate pad and the data pad, removing the protective film from a portion of the pad area by utilizing the alignment film as a mask to expose the transparent conductive film included in the pad area, and scribing the substrate along a scribing line where the scribing line crosses a shorting line connected to the data pad and the gate pad, wherein the shorting line is provided so that at least one of the transparent conductive film and a data metal layer is exposed along a side portion of the substrate during the scribing step.

In another aspect, the method of fabricating a liquid crystal display panel including the steps of providing a thin film transistor array substrate structure having a gate line and a data line disposed on a substrate and insulated from each other by a gate insulating pattern therebetween, a thin film transistor disposed at an intersection of the gate line and the data line, a pixel electrode connected to the thin film transistor, a protective film disposed to protect the thin film transistor, a pad structure connected to a respective one of the gate line and data line and including a transparent conductive film and a data metal layer, joining a color filter array substrate structure with the thin film transistor array substrate structure, and providing a protective film within an area where the color filter array substrate structure overlaps with the thin film transistor array substrate structure so that either the data metal layer or the transparent conductive film is exposed along a side portion of the substrate.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the principle of the present invention. In the drawings:

FIG. 3A to FIG. 3D are views illustrating a step-by-step method of fabricating the thin film transistor array substrate structure of FIG. 2;

FIG. 11A to FIG. 11C are cross-sectional views explaining a method of fabricating the thin film transistor array substrate structure of FIG. 10;

FIG. 17A to FIG. 17C are cross-sectional views explaining a method of fabricating the thin film transistor array substrate structure of FIG. 16;

FIG. 18A to FIG. 18E are cross-sectional views explaining a third mask process in a method of fabricating the thin film transistor array substrate structure of FIG. 17C;

FIG. 21 is a cross-sectional view showing the lower substrate in which the transparent conductive film according to the present invention is exposed along the side surface thereof; and FIG. 22 is a cross-sectional view showing other example of a liquid crystal display panel including the thin film transistor array substrate structure according to the fifth embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Hereinafter, the preferred embodiments of the present invention will be described in detail with reference to FIGS. 5 to 22.

Figure 1:
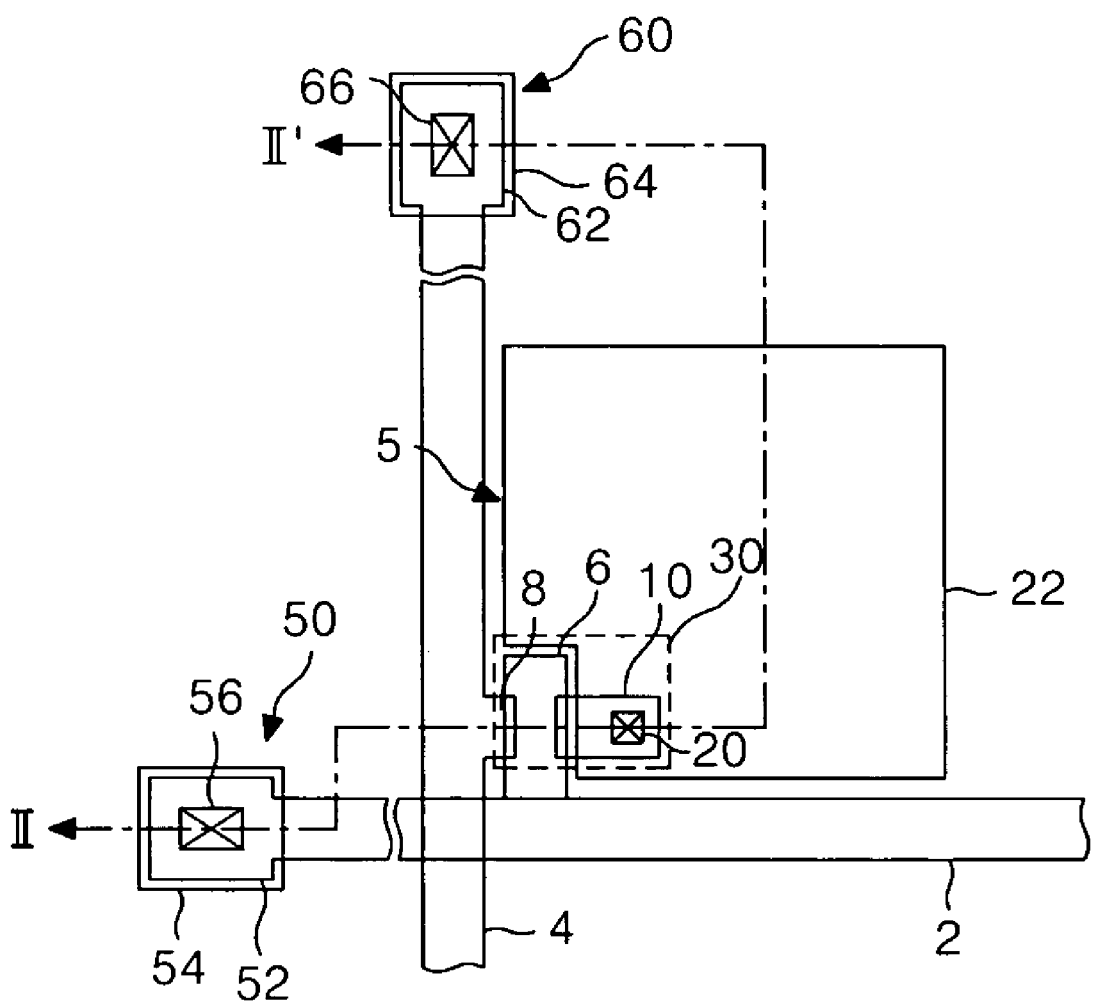
FIG. 1 is a plan view showing a structure of a related art thin film transistor array substrate structure.
Figure 2:
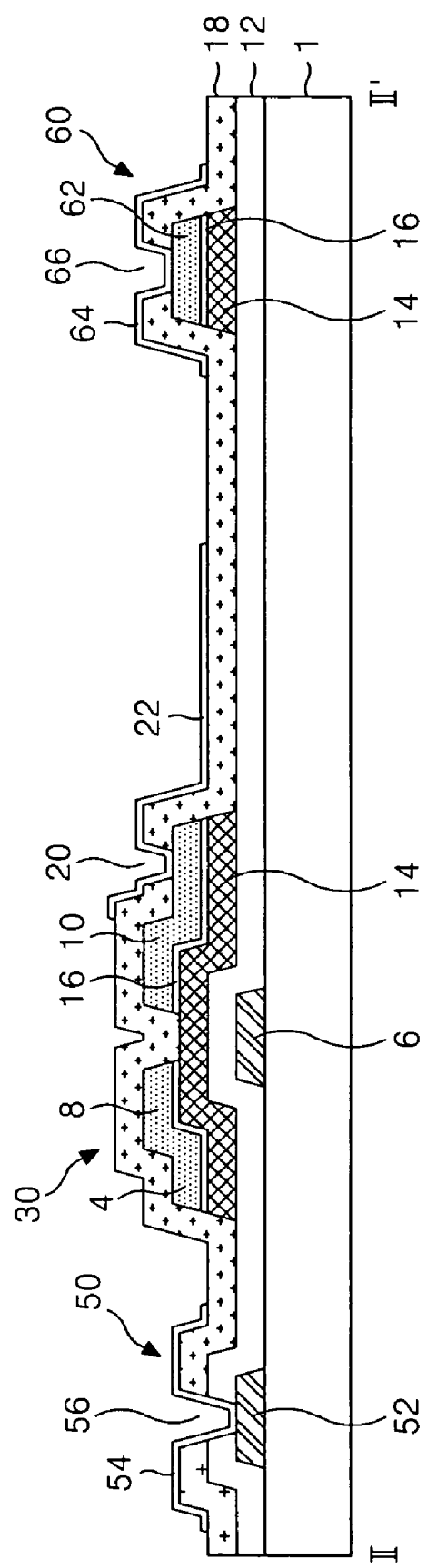
FIG. 2 is a cross-sectional view of the thin film transistor array substrate structure taken along line II–II' of FIG. 1.
Figure 3A:
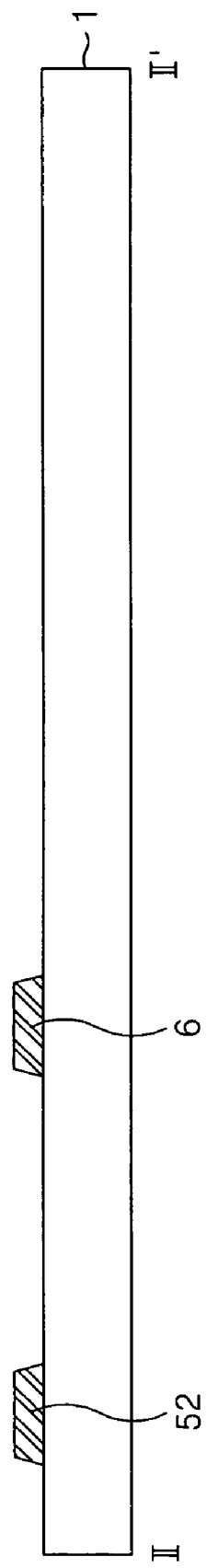
Figure 3B:
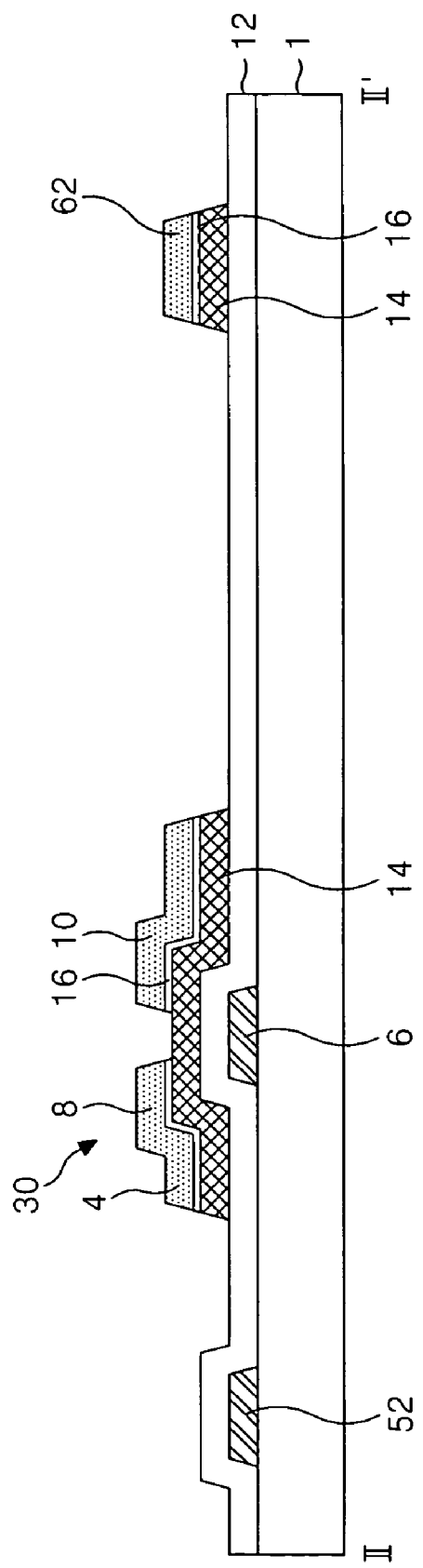
Figure 3D:
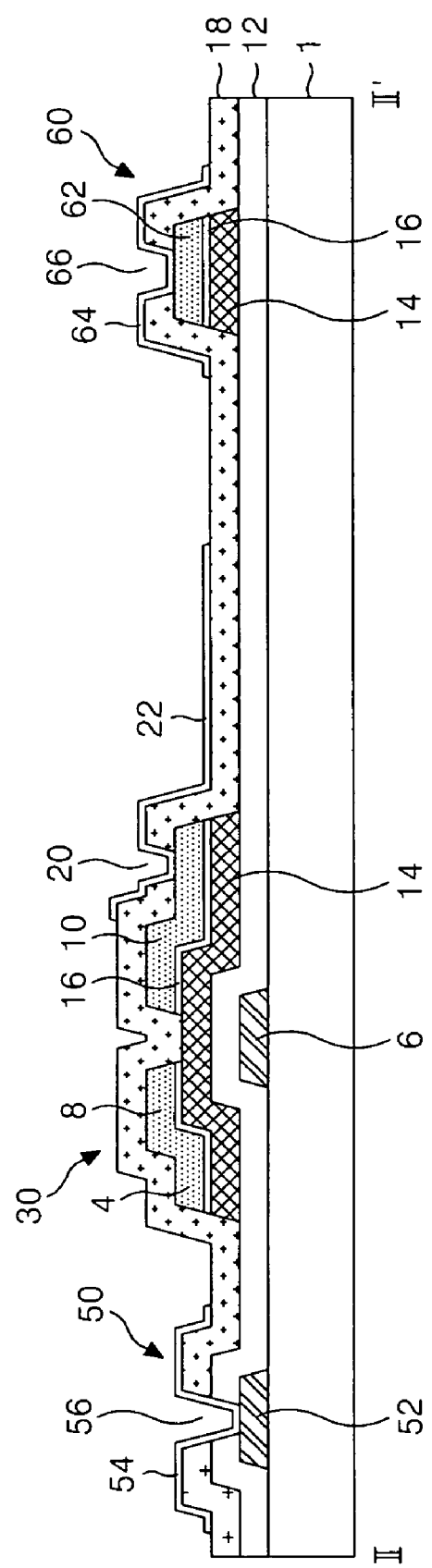
Figure 4A:
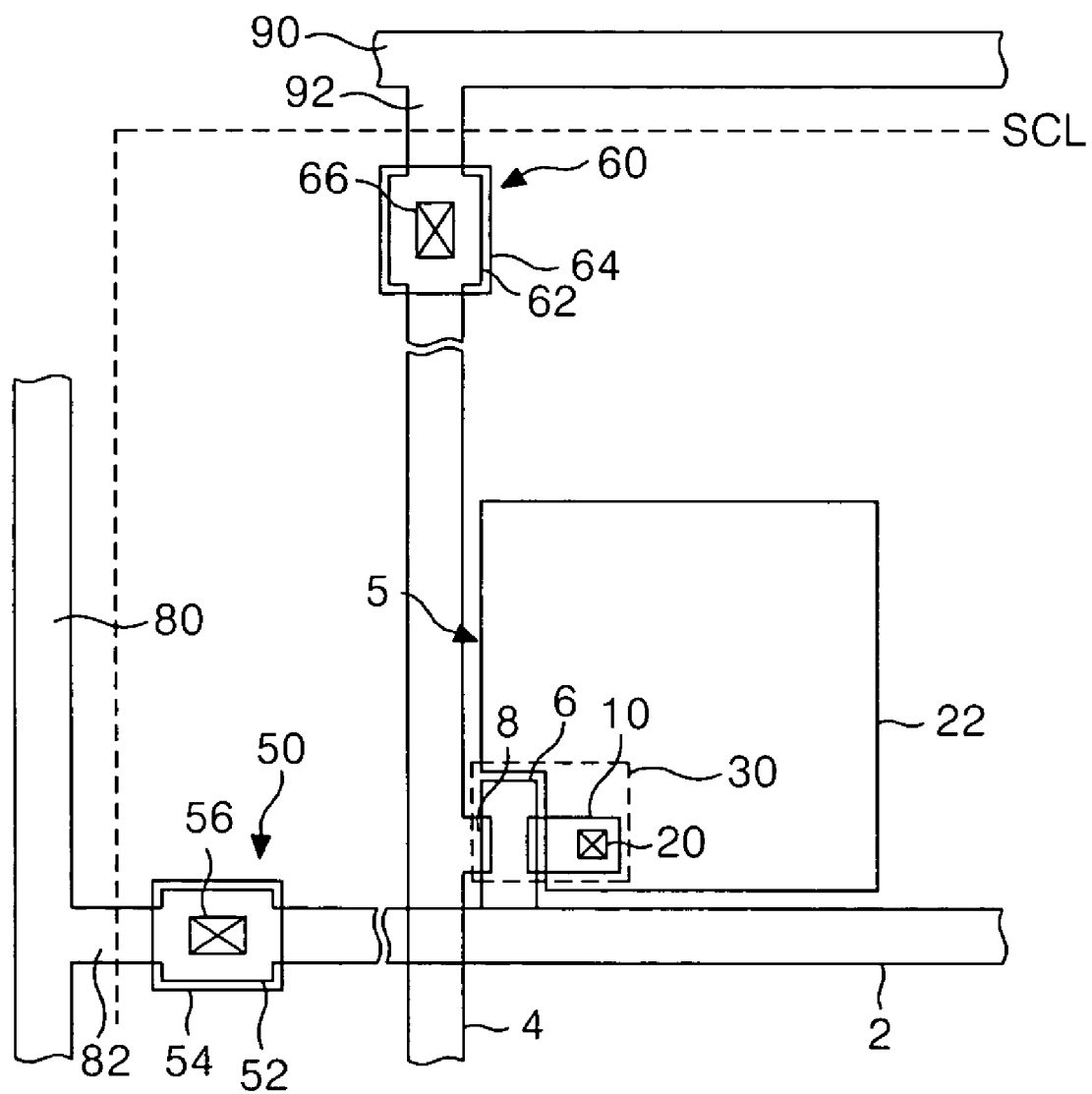
FIG. 4A and FIG. 4B are a plan view and a cross-sectional view showing a gate shorting bar and a data shorting bar extended form the gate pad and the data pad of FIGS. 1 and 2.
Figure 4B:
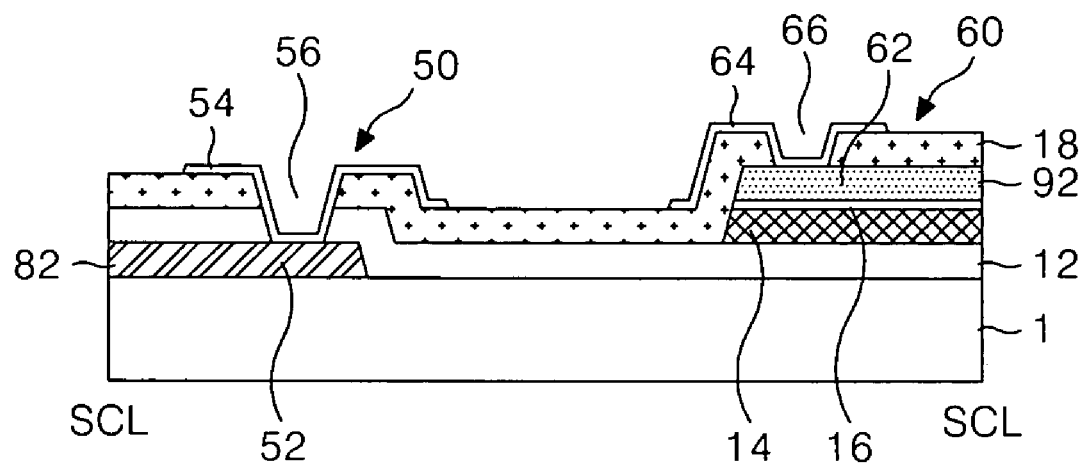
Figure 5:
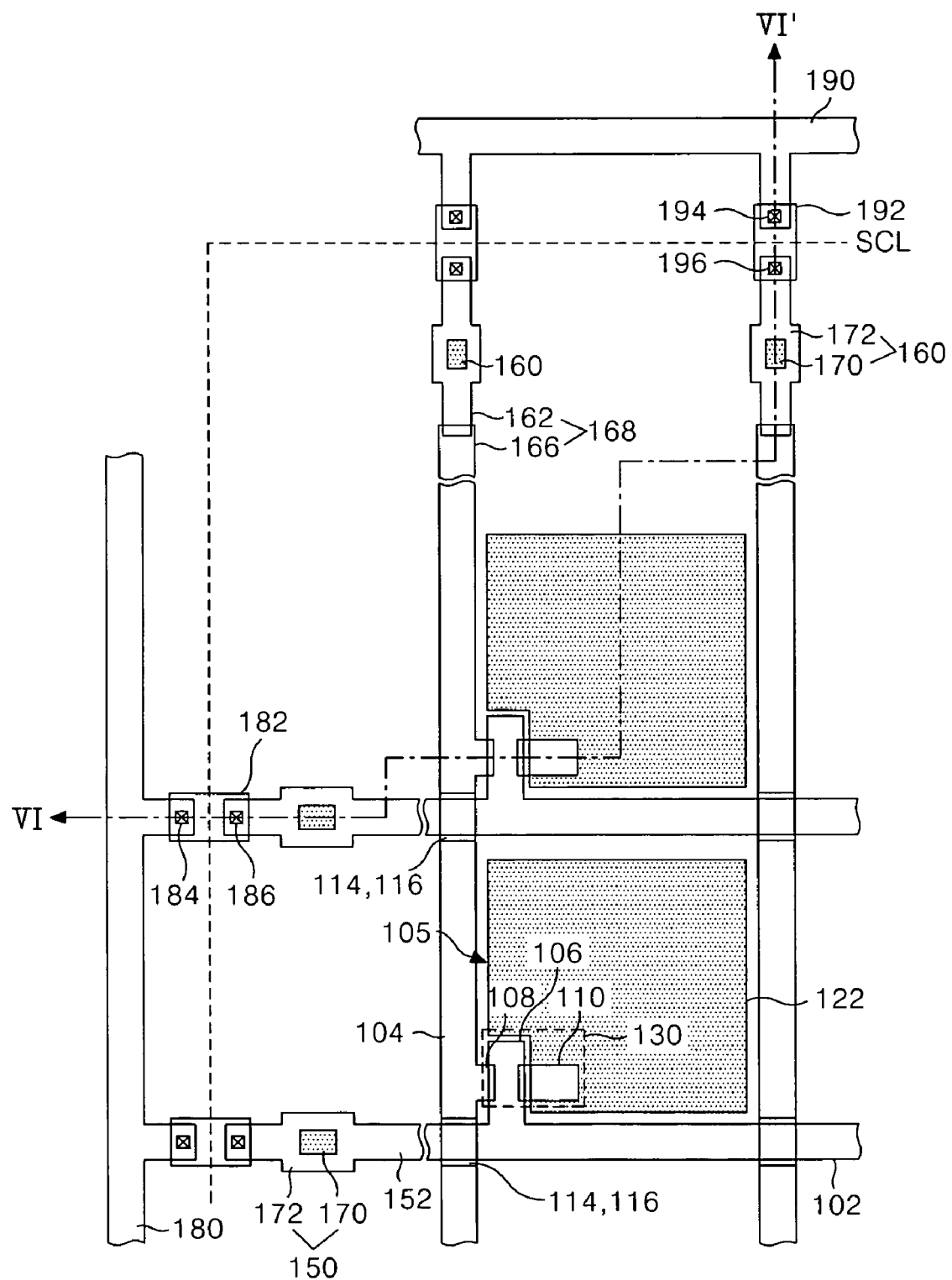
FIG. 5 is a plan view showing a structure of a thin film transistor array substrate structure according to a first exemplary embodiment of the present invention.
Figure 6:
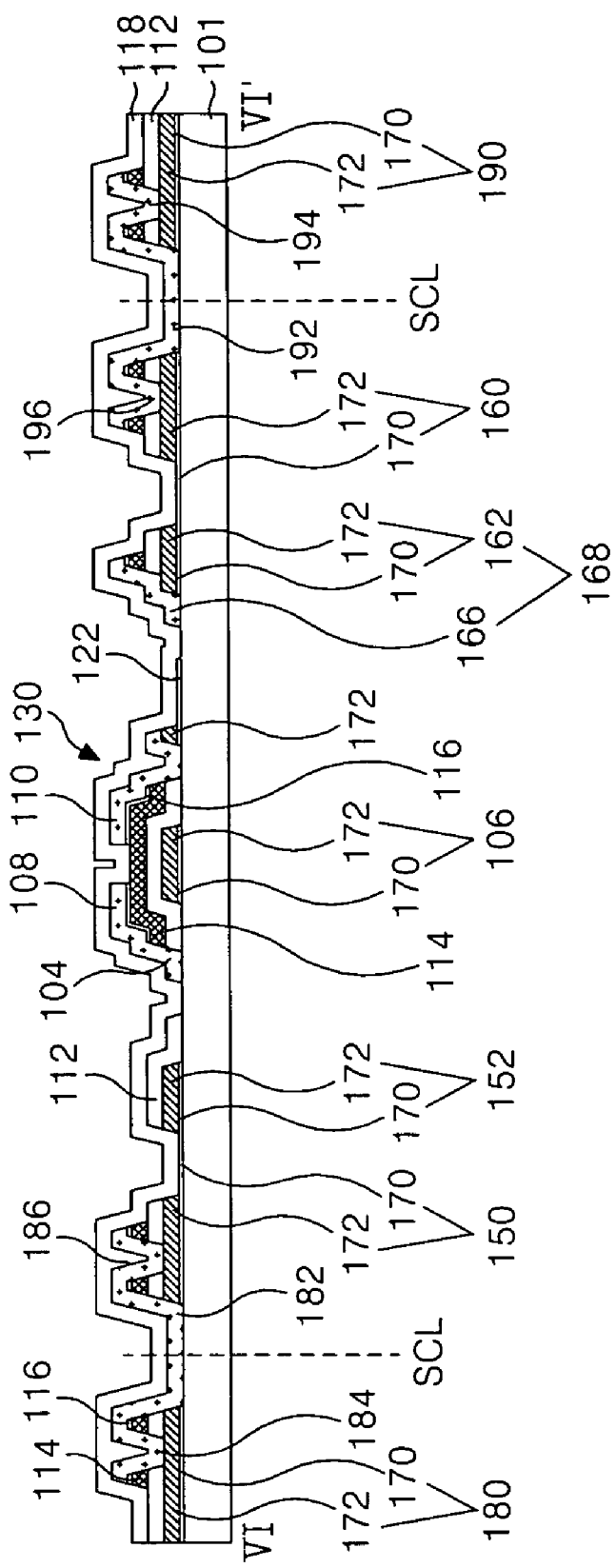
FIG. 6 is a cross-sectional view of the thin film transistor array substrate structure taken along line II–II' of FIG. 5.

FIG. 5 is a plan view showing a structure of a thin film transistor array substrate structure according to a first embodiment of the present invention, and FIG. 6 is a cross-sectional view of the thin film transistor array substrate structure taken along the line VI-VI' of FIG. 5. Referring to FIG. 5 and FIG. 6, the thin film transistor array substrate structure includes a display portion for implementing a picture, a pad portion for applying driving signals to signal lines of the display portion, and a shorting portion for inspecting a performance of the display part.

The display portion includes a gate line 102 and a data line 104 provided on a lower substrate 101 intersecting each other and having a gate insulating pattern 112 disposed therebetween. The gate line 102 is provided to apply a gate signal and the data line 104 is provided to apply a data signal at the intersection structure to define the pixel area 105. The display portion further includes a thin film transistor 130 provided at the intersection, and a pixel electrode 122 provided at a pixel area defined by the intersection structure. The thin film transistor 130 allows a pixel signal on the data line 104 to be charged and maintained at the pixel electrode 122 in response to a gate signal on the gate line 102.

The thin film transistor 130 includes a gate electrode 106 connected to the gate line 102, a source electrode 108 connected to the data line 104, and a drain electrode 110 connected to the pixel electrode 122. Further, the thin film transistor 130 includes an active layer 114 overlapping the gate electrode 106 with having the gate insulating pattern 112 disposed therebetween to define a channel between the source electrode 108 and the drain electrode 110. An ohmic contract layer 116 for making a contact with the data line 104 and the drain electrode 110 is further provided on the active layer 114.

The pixel electrode 122 is directly connected to the drain electrode 110 of the thin film transistor 130, and is provided at a pixel area 105. The pixel electrode 122 includes a transparent conductive film 170 which is exposed and formed at the pixel area 105, and a gate metal film 172 is provided at the portion appropriate to the drain electrode 110 on the transparent conductive film 170.

Accordingly, an electric field is formed between the pixel electrode 122 to which a pixel signal is applied via the thin film transistor 130 and a common electrode (not shown) supplied with a reference voltage. Such an electric field rotates liquid crystal molecules between the thin film transistor array substrate and the color filter array substrate structure owing to a dielectric anisotropy. Transmittance of a light to the pixel area 105 is varied depending upon a rotation extent of the liquid crystal molecules, thereby implementing a gray level scale.

The pad portion includes a gate pad 150 extended from the gate line 102, and a data pad 160 extended from the data line 104. The gate pad 150 is connected to a gate driver (not shown) which generates a gate signal and applies the gate signal to the gate line 102 via a gate link 152. The gate pad 150 has a structure in which the transparent conductive film 170 included in both gate pad 150 and gate link 152 connected to the gate line 102 is exposed. The data pad 160 is connected to a data driver (not shown) which generates a data signal and applies the data signal to the data line 104 via a data link 168. The data pad 160 has a structure in which the transparent conductive film 170 included in the data link 168 connected to the data line 104 is exposed. Herein, the data link 168 comprises a lower data link electrode 162 formed simultaneously with the gate link 152, and an upper data link electrode 166 connected to the data line 104.

The shorting portion includes a shorting bar supplied with an inspection signal to inspect a performance of the signal line including the gate line 102 and the data line 104, and a performance of the thin film transistor 130. Further, the shorting bar is connected to a ground voltage source GND to shut off a static electricity transferred into the signal lines of the liquid crystal display panel during the fabrication process to protect the thin film transistor 130 from the static electricity.

The shorting bar includes a gate shorting bar 180 connected to the gale line 102 via the gate pad 150, and a data shorting bar 190 connected to the date line 104 via the data pad 160. The gate shorting bar 180 has a structure in which the transparent conductive film 170 and the gate metal film 172 formed thereon are exposed. The gate shorting bar 180 is electrically connected to the gate pad 150 via a gate shorting line 182. The data shorting bar 190 has a structure in which the transparent conductive film 170 and the gate metal film 172 formed thereon are exposed. The data shorting bar 190 is electrically connected to the data pad 160 via a data shorting line 192. The gate shorting line 182 and the data shorting line 192 are formed of a metal identical to the data line, for example, a metal having a strong corrosion resistance such as molybdenum (Mo), chrome (Cr), titanium (Ti), tantalum (Ta) or MoW.

The gate shorting line 182 is connected to both the gate shorting bar 180 and the gate pad 150 via a shorting contacting hole 184 and a second contact hole 186, respectively. Both the first and second contact holes 184 and 186 are formed to pass through the insulating film 112, the active layer 114, and the ohmic contact layer 116. The data shorting line 192 is connected to both the data shorting bar 190 and the data pad 160 via a third shorting contact hole 194 and a fourth shorting contact hole 196, respectively. Both the third and fourth shorting contact holes 194 and 196 are formed to pass through the gate pad 160 via insulating film 112, the active layer 114, and the ohmic contact layer 116.

The gate shorting line 182 and the date shorting line 192 are formed of a metal having a strong resistance to an electrochemical corrosion. The data metal layer 109 used to form the shorting lines 182 and 192 are exposed along the side surface of the lower substrate 101 during the scribing process. This prevents a corrosion of the shorting lines 182 and 192 and furthermore prevents a corrosion of the gate pad 150 and the data pad 160.

Figure 7A:
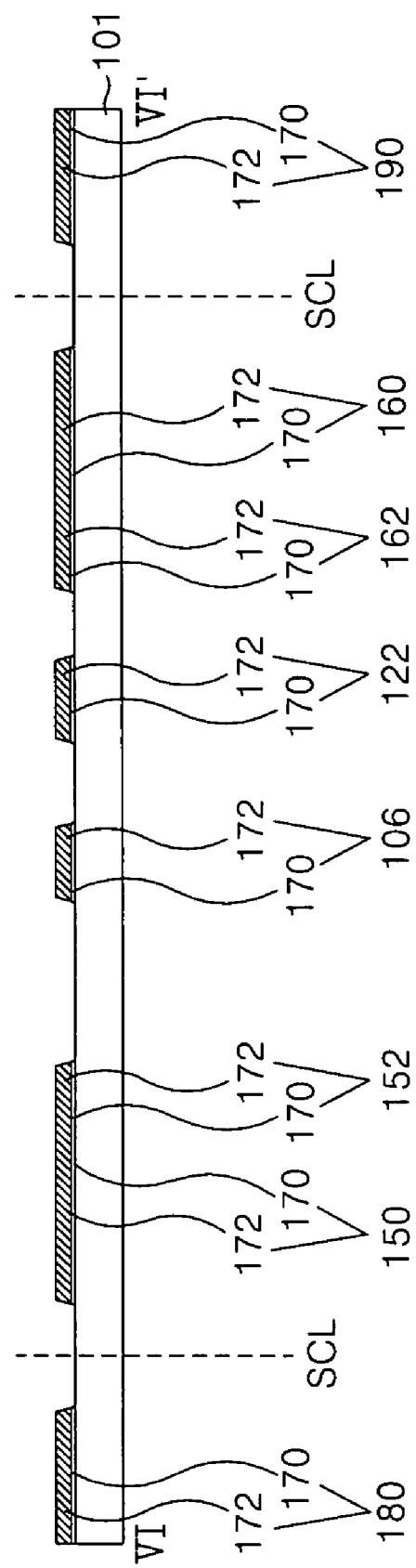
FIG. 7A to FIG. 7C are cross-sectional views explaining a method of fabricating the thin film transistor array substrate structure according to the first embodiment of the present invention.
Figure 7B:
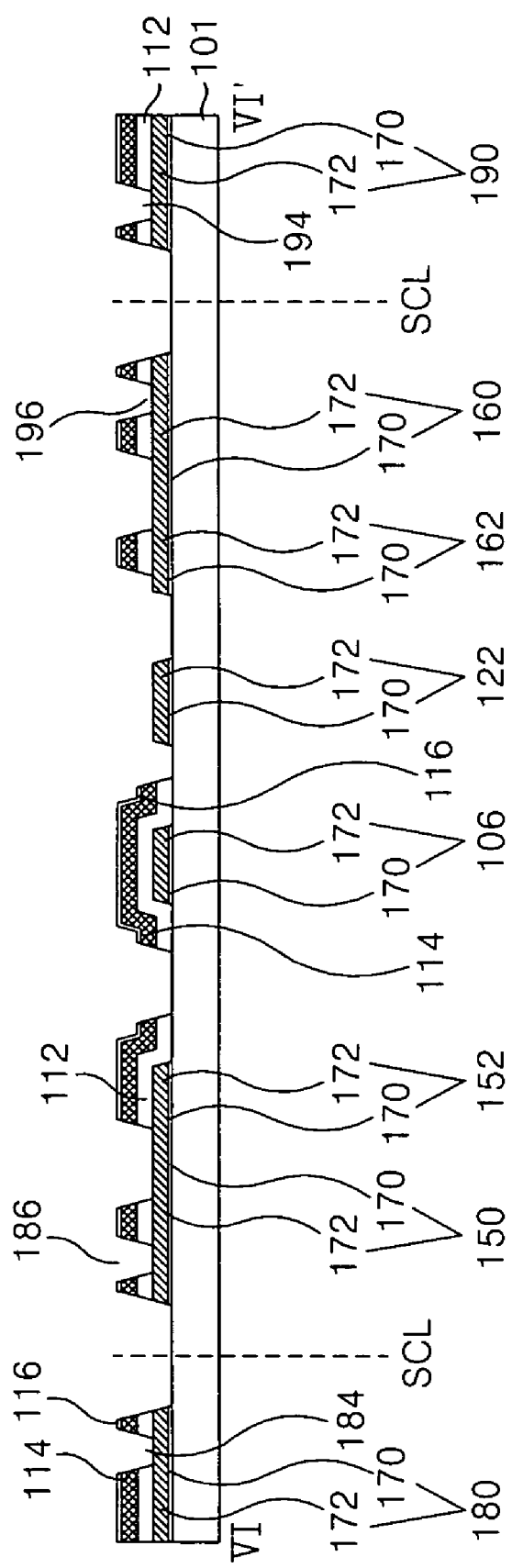
Figure 7C:
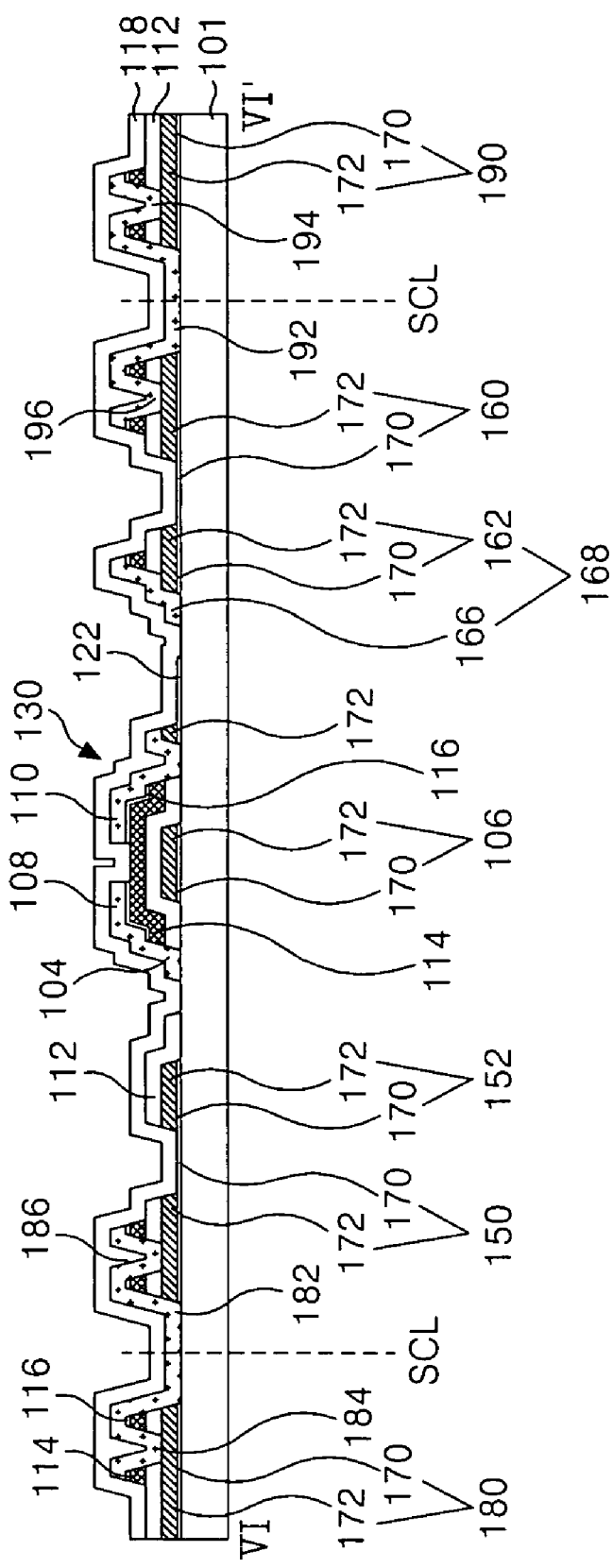

FIG. 7A to FIG. 7C are cross-sectional views taken along the lines VI-VI', for explaining a method of fabricating the thin film transistor array substrate structure according to the first embodiment of the present invention. Referring to FIG. 7A, the pixel electrode 122; and a first conductive pattern group including the gate line 102, the gate electrode 106, the gate link 152, the gate pad 150, the data pad 160, the lower data link electrode 162, the gate shorting bar 180, and the data shorting bar 190 formed on the lower substrate 101 by the first mask process.

More specifically, the transparent conductive film 170 and the gate metal film 172 are sequentially disposed on the lower substrate 101 by a deposition technique such as the sputtering. The transparent conductive film 170 is made from a transparent conductive material such as indium-tin-oxide (ITO), tin-oxide (TO), indium-tin-zinc-oxide (ITZO), indium-zinc-oxide (IZO) or the like. The gate metal film 172 is made from a metal such as an aluminum group metal, molybdenum (Mo), copper (Cu) or the like. Then, the transparent conductive film 170 and the gate metal film 172 are patterned by photolithography and etching processes using a first mask to provide the pixel electrode 122 and the first conductive pattern group.

Referring to FIG. 7B, a gate insulating pattern 112 and a semiconductor pattern including the active layer 114 and the ohmic contact layer 116 are formed by the second mask process on the lower substrate 101 already provided with the first conductive pattern group. More specifically, the gate insulating pattern 112 and the active layer 114, and the ohmic contact layer 116 are sequentially formed by a deposition technique such as the PEVCD, the sputtering or the like on the lower substrate 101. The gate insulating pattern 112 is formed from an inorganic insulating material such as silicon nitride ($SiN_x$) or silicon oxide ($SiO_x$). The active layer 114 (i.e., first semiconductor layer) is formed from amorphous silicon not doped with an impurity. The ohmic contact layer 116 (i.e., second semiconductor layer) is formed from amorphous silicon doped with an N-type or P-type impurity. Then, the gate insulating pattern 112 and the first and second semiconductor layers are patterned by the etching process using a second mask to provide the gate insulating pattern 112 overlapping the gate line 102, the gate electrode 106, the gate link 152, and the data link 162 and the semiconductor pattern.

The semiconductor pattern includes the active layer 114 and the ohmic contact layer 116 formed on the gate insulating pattern 112. The semiconductor pattern is provided with a larger width than the first conductive pattern group to prevent a deterioration of channel characteristic which may occur if the semiconductor pattern has a smaller width than the gate electrode 106. Further, the first to fourth shorting contact holes 184, 186, 194 and 196 are provided to expose a portion of the gate shorting bar 180, the gate pad 150, the data shorting bar 190, and the data pad 160, respectively.

Referring to FIG. 7C, a second conductive pattern group including the data line 104, the source electrode 108, the drain electrode 110, the upper data link electrode 166, the gate shorting line 182 and the data shorting line 192 are formed on the lower substrate 101 already provided with the gate insulating pattern 112, the semiconductor pattern, and the first to fourth shorting contact holes 184, 186, 194 and 196 created by a third mask process. In addition, portions of the gate metal film 172 included in the data pad 160, the gate pad 150 and the pixel electrode 122 are removed to expose the transparent conductive film 170.

Figure 8A:
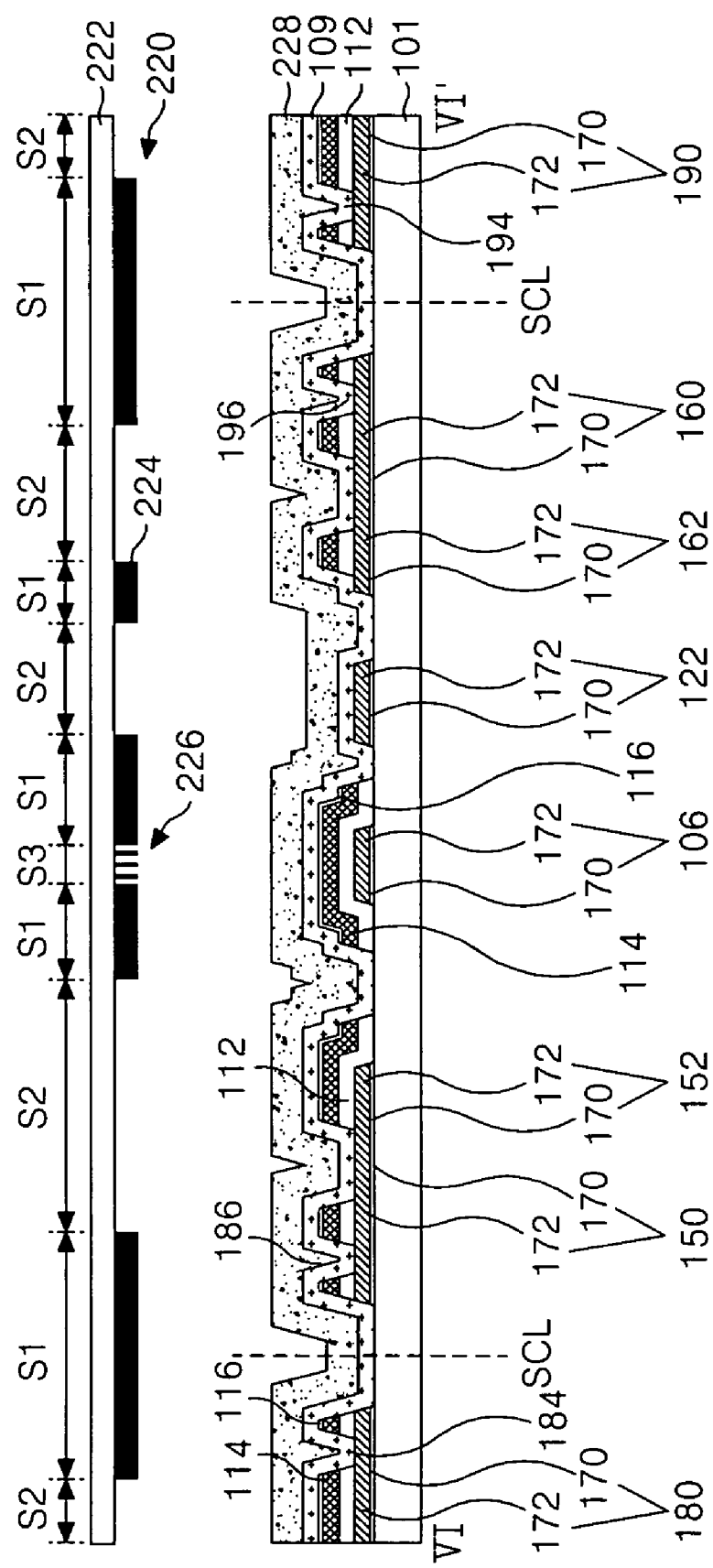
FIG. 8A to FIG. 8E are cross-sectional views for specially explaining a third mask process in a method of fabricating the thin film transistor array substrate structure of FIG. 7C.

The third mask process will be described with reference to FIG. 8A to FIG. 8E below. As shown in FIG. 8A, a data metal layer 109 and a photo-resist film 228 are sequentially formed on the lower substrate 101 already provided with the semiconductor pattern by a deposition technique such as the sputtering, etc. The data metal layer 109 is formed from a metal such as molybdenum (Mo), copper (Cu) or the like. Then, the third mask 220, that is a partial exposure mask, is aligned at the upper portion of the lower substrate 101. The third mask 220 includes a mask substrate 222 made from a transparent material, a shielding part 224 provided at a shielding area S1 of the mask substrate 222, and a diffractive exposure part (or transflective part) 226 provided at a partial exposure area S3 of the mask substrate 222. The remaining portions of the mask substrate 222 (area not used as S1 or S3) becomes an exposure area S2.

Figure 8B:
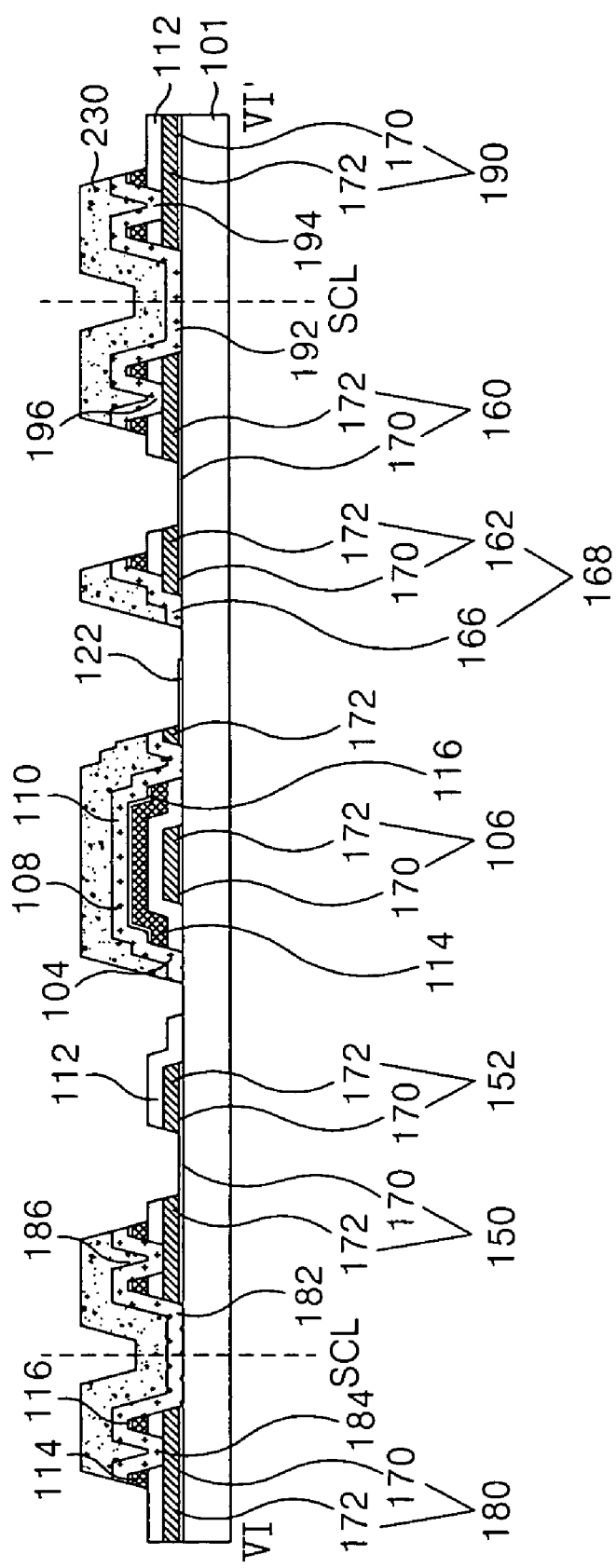

As shown in FIG. 8B, the photo-resist film 228 is removed using the third mask 220 and then developed to provide a photo-resist pattern 230 having step coverage at the shielding area S1 and the partial exposure area S3 in correspondence with the shielding part 224 and the diffractive exposure part 226 of the third mask 220. The photo-resist pattern 230 has a lower height at the partial exposure part S3 than to the shielding area S1.

The data metal layer 109 is patterned by the wet etching process using the photo-resist pattern 230 as a mask, thereby providing a second conductive pattern group. The second conductive pattern group includes the data line 104, the source electrode 108 and the drain electrode 110 connected to one side of the data line 104, the upper data link electrode 166 connected to other side of the data line 104, the gate shorting line 182, and the data shorting line 192. Further, the gate metal film 172 in the second conductive pattern group is removed by utilizing the gate insulating pattern 112 as a mask, thereby exposing portions of the transparent conductive film 170 included in the data pad 160, the gate pad 150 and the pixel electrode 122. Next, the active layer 114 and the ohmic contact layer 116 are formed with respect to the second conductive pattern group by the dry etching using the photo-resist pattern 230 as a mask. At this time, the active layer 114 and the ohmic contact layer 116 disposed at an area other than the second conductive pattern group are removed. This aims at preventing a short between the liquid crystal cells caused by the semiconductor pattern including the active layer 114 and the ohmic contact layer 116.

Figure 8C:
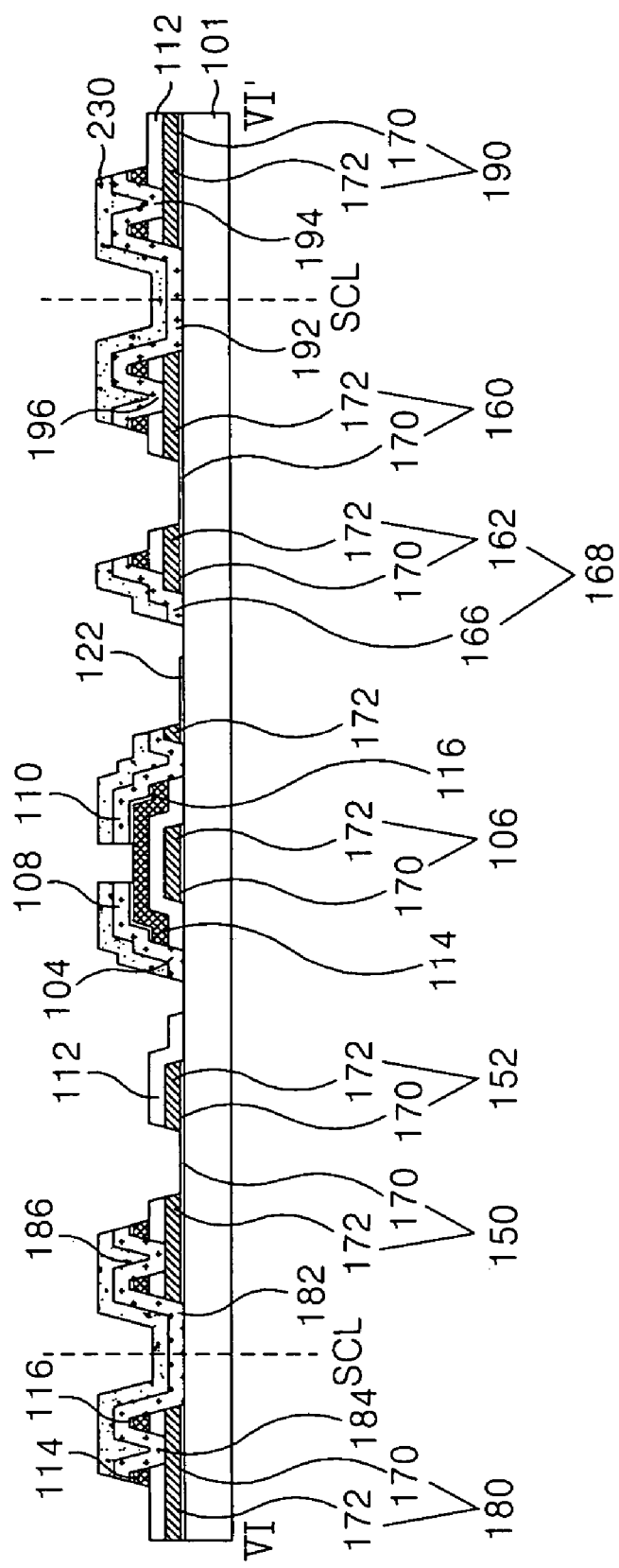
Figure 8D:
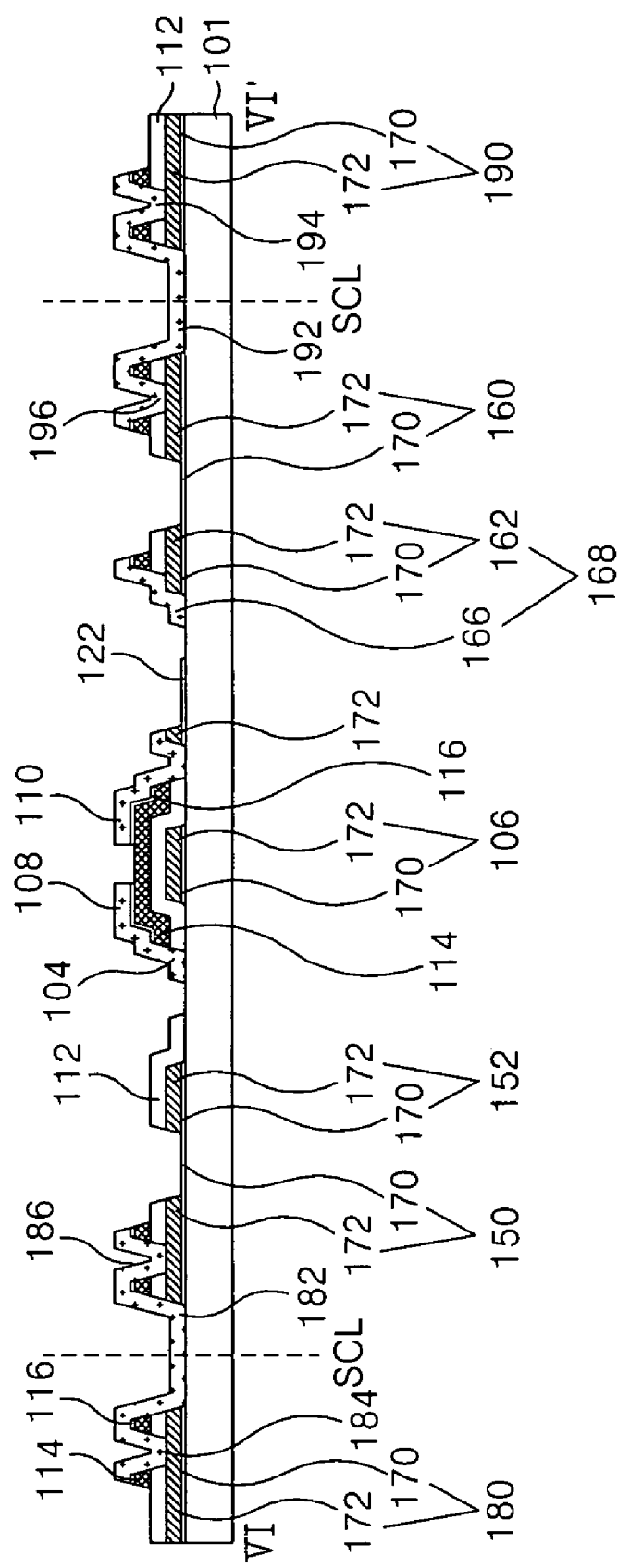
Figure 8E:
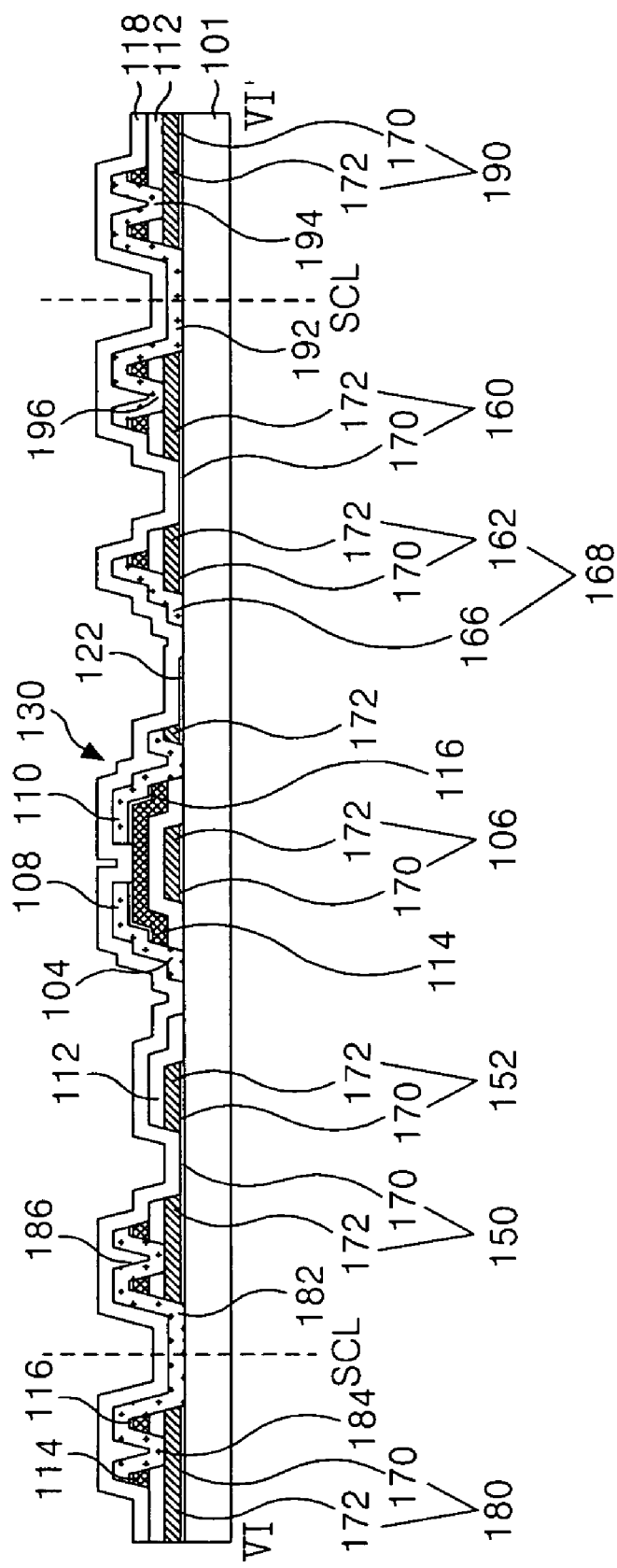

Then, as shown in FIG. 8C, the photo-resist pattern 230 having a lower height at the partial exposure area S3 is removed by the ashing process using oxygen ($O_2$) plasma. The photo-resist pattern 230 at the shielding area S1 becomes a lower height than an initial height. The data metal layer 109 and the ohmic contact layer 116 provided at the partial exposure area S3 (the channel portion of the thin film transistor) are removed by the etching process using the photo-resist pattern 230, thereby disconnecting the drain electrode 110 from the source electrode 108. Further, as shown in FIG. 8D, the photo-resist pattern 230 left on the second conductive pattern group is removed by the stripping process. Subsequently, as shown in FIG. 8E, a protective film 118 is formed over an entire surface of the substrate 101. The protective film 118 is made from an inorganic insulating material identical to the gate insulating pattern 112, or an organic insulating material such as an acrylic organic compound having a small dielectric constant, BCB (benzocyclobutene) or PFCB (perfluorocyclobutane), etc.

Figure 9:
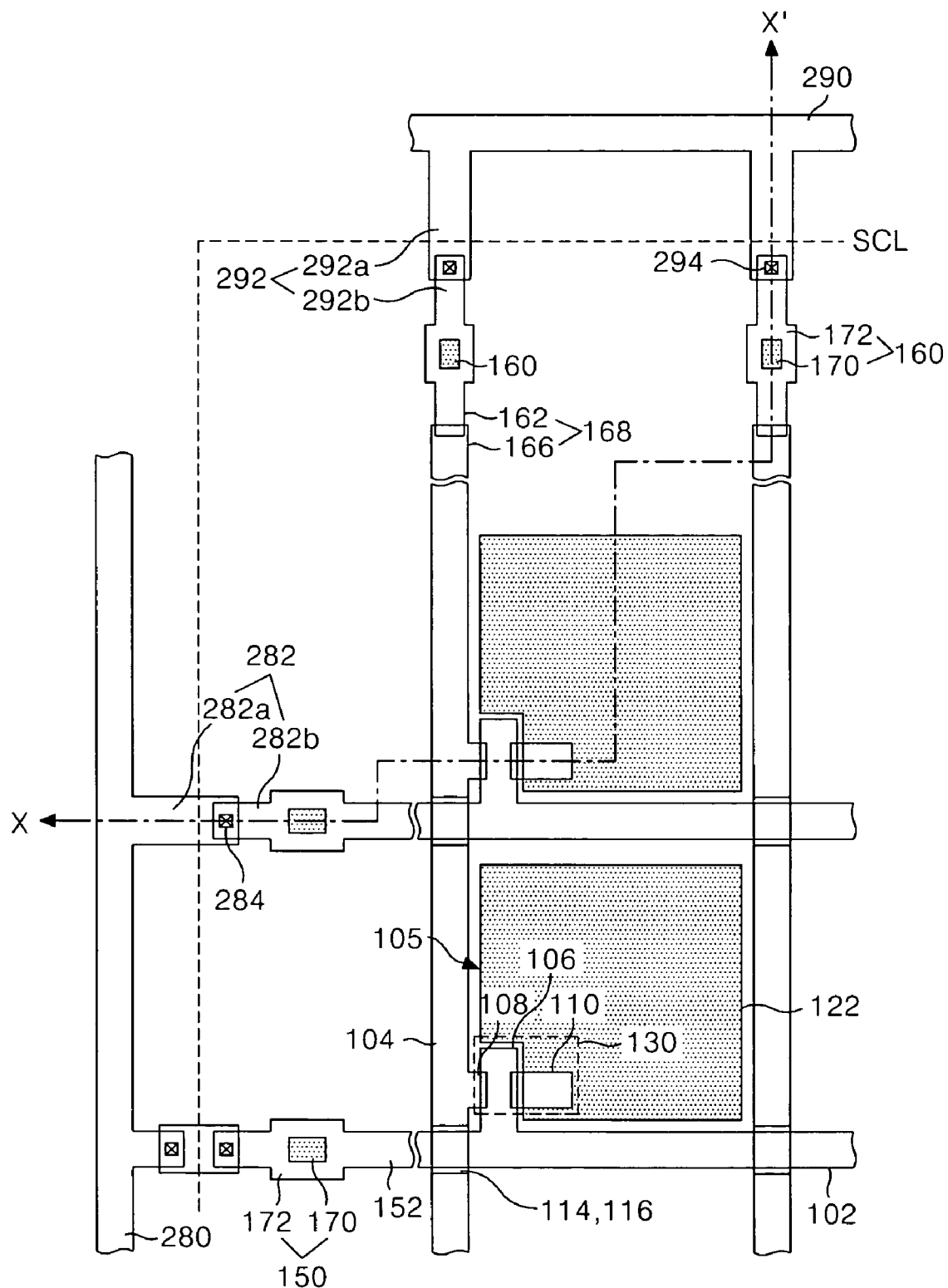
FIG. 9 is a plan view showing a structure of a thin film transistor array substrate structure according to a second exemplary embodiment of the present invention.
Figure 10:
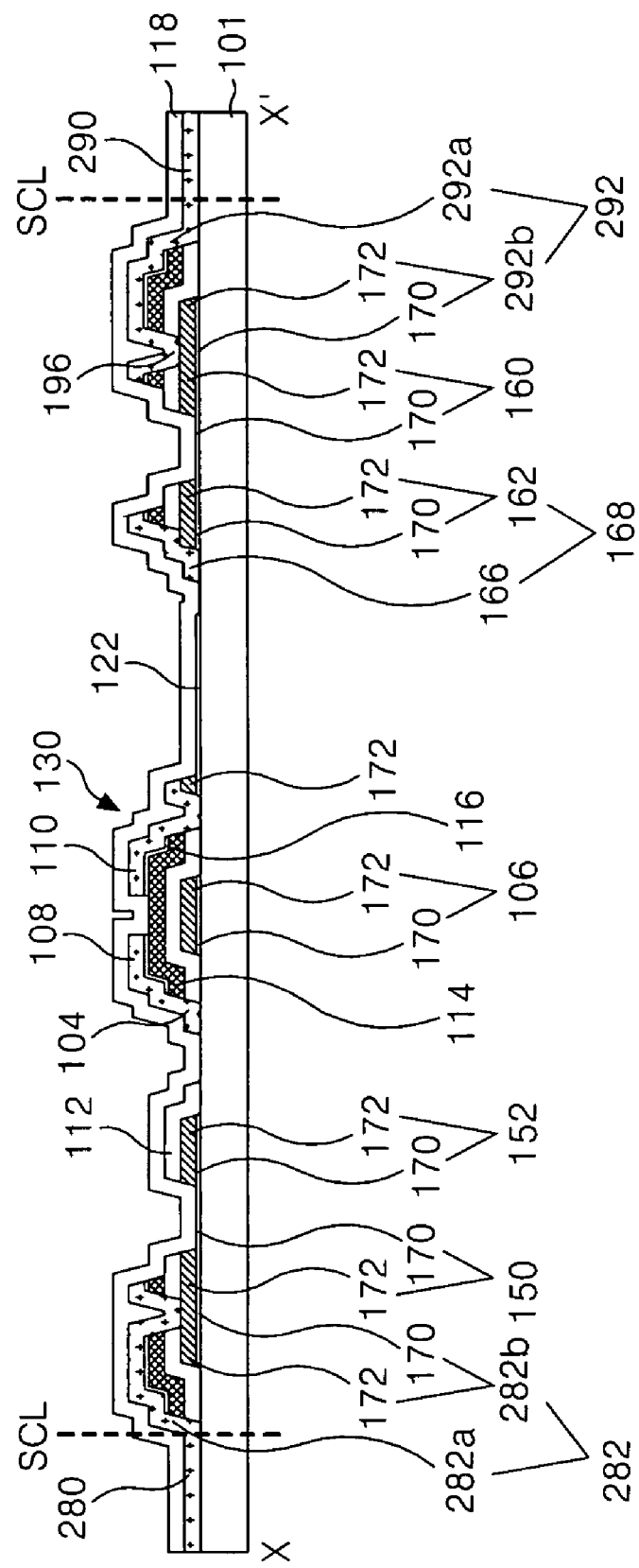
FIG. 10 is a cross-sectional view of the thin film transistor array substrate structure taken along line X–X' of FIG. 9.

FIG. 9 is a plan view showing a structure of a thin film transistor array substrate structure according to a second embodiment of the present invention, and FIG. 10 is a cross-cross-sectional view of the thin film transistor array substrate structure taken along line X-X' of FIG. 9. The thin film transistor array substrate structure shown in FIG. 9 and FIG. 10 has similar elements as that of shown in FIG. 5 and FIG. 6 except that a gate shorting bar 280 and a data shorting bar 290 are formed from a metal having a strong resistance to an electro-chemical corrosion. Thus, a detailed explanation of the similar elements will be omitted.

The gate shorting bar 280 is formed from a metal identical to the data line 104, for example, a metal having a strong corrosion resistance such as molybdenum (Mo), chrome (Cr), titanium (Ti), tantalum (Ta) or MoW. The gate shorting bar 280 is electrically connected to the gate pad 150 via a gate shorting line 282. The gate shorting line 282 includes a first gate shorting line 282a extended from the gate shorting bar 280 crossing a scribing line SCL, and a second gate shorting line 282b extended from the gate pad 150. The first and second gate shorting lines 282a and 282b are electrically connected to the gate insulating pattern 112 via a first shorting contact hole 284 passing through the active layer 114 and the ohmic contact layer 116. The first gate shorting line 282a is formed from a metal having a strong resistance to the electro-chemical corrosion, in a similar manner to the gate shorting bar 280. The second gate shorting line 282b is comprised of the transparent conductive film 170 and the gate metal film 172 formed in a similar manner to that of the gate pad 150.

The data shorting bar 290 is formed from a metal identical to the data line 104, for example, a metal having a strong corrosion resistance such as molybdenum (Mo), chrome (Cr), titanium (Ti), tantalum (Ta) or MoW. The data shorting bar 290 is electrically connected to the data pad 160 via a data shorting line 292 and includes a first data shorting line 292a extended from the data shorting bar 290 crossing the scribing line SCL, and a second data shorting line 292b extended from the data pad 160. The first and second data shorting lines 292a and 292b are electrically connected to the gate insulating pattern 112 via a second shorting contact hole 294 passing through the active layer 114 and the ohmic contact layer 116. The first data shorting line 292a is formed from a metal having a strong resistance to the electro-chemical corrosion in a similar manner to that of the data shorting bar 290. The second data shorting line 292b is comprised of the transparent conductive film 170 and the gate metal film 172 formed in similar manner to that of the data pad 160.

As mentioned above, the shorting lines 282a and 292a provided at an area corresponding to the scribing area are formed from a metal identical to the data line 104, which has a strong resistance to the electrochemical corrosion. During the scribing process, metal forming the shorting lines 282 and 292 are exposed along the side surface of the lower substrate 101. This prevents a corrosion of the shorting lines 282 and 292 and furthermore prevents a corrosion of the gate pad 150 and the data pad 160.

Figure 11C:
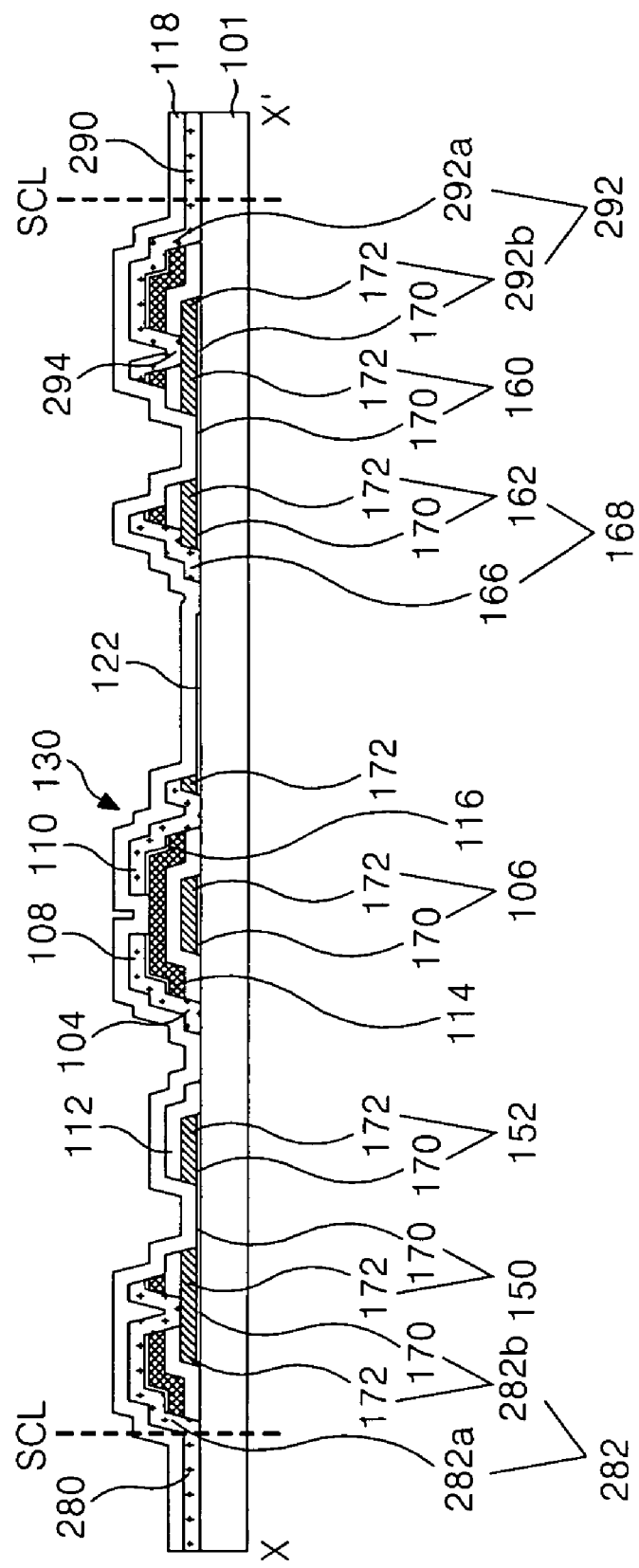

Next, a method of fabricating a thin film transistor array substrate structure of the liquid crystal display panel according to the second embodiment will be described below. As shown in FIG. 11A, a first conductive pattern group including the gate line 102, the gate electrode 106, the second gate shorting line 282b, the second data shorting line 292b, the gate pad 150 and the data pad 160 are provided on the lower substrate 101 by the first mask process. As shown in FIG. 11B, the gate insulating pattern 112 having first and second shorting contact holes 284 and 294 and the semiconductor pattern (the active layer 114 and ohmic contact layer 116) are provided by the second mask process. As shown in FIG. 11C, a second conductive pattern group including the gate shorting bar 280, the data shorting bar 290, the first gate shorting line 282a, the first data shorting line 292a, the source electrode 108, the drain electrode 110, the data line 104 and the upper data link electrode 166 are provided. The portions of transparent conductive film 170 included in the gate pad 150, the data pad 160 and the pixel electrode 122 are exposed by the third mask process. Then, the protective film 118 for protecting the thin film transistor 130 is provided over the entire surface of the lower substrate 101.

Figure 12:
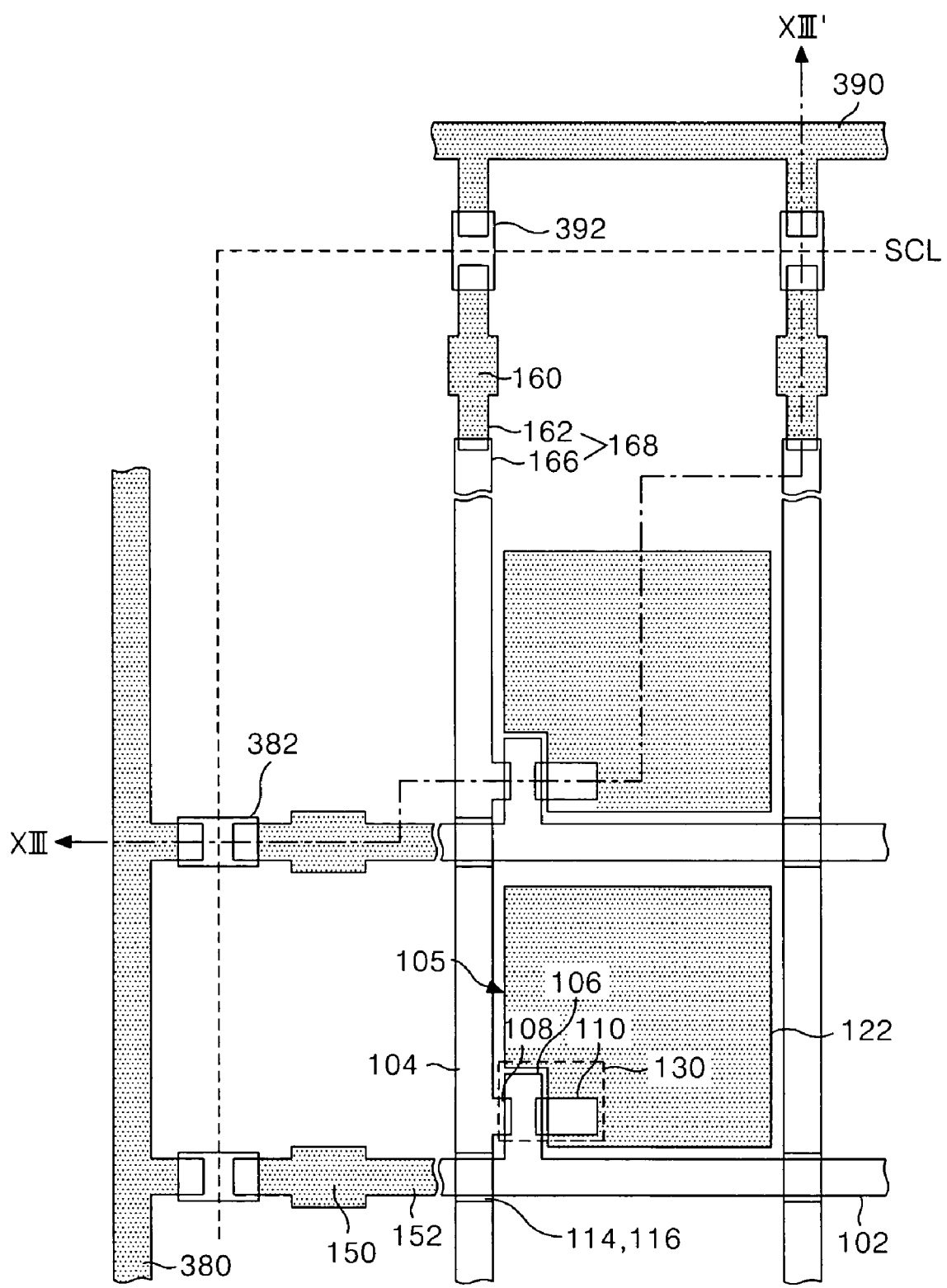
FIG. 12 is a plan view showing a structure of a thin film transistor array substrate structure according to a third exemplary embodiment of the present invention.
Figure 13:
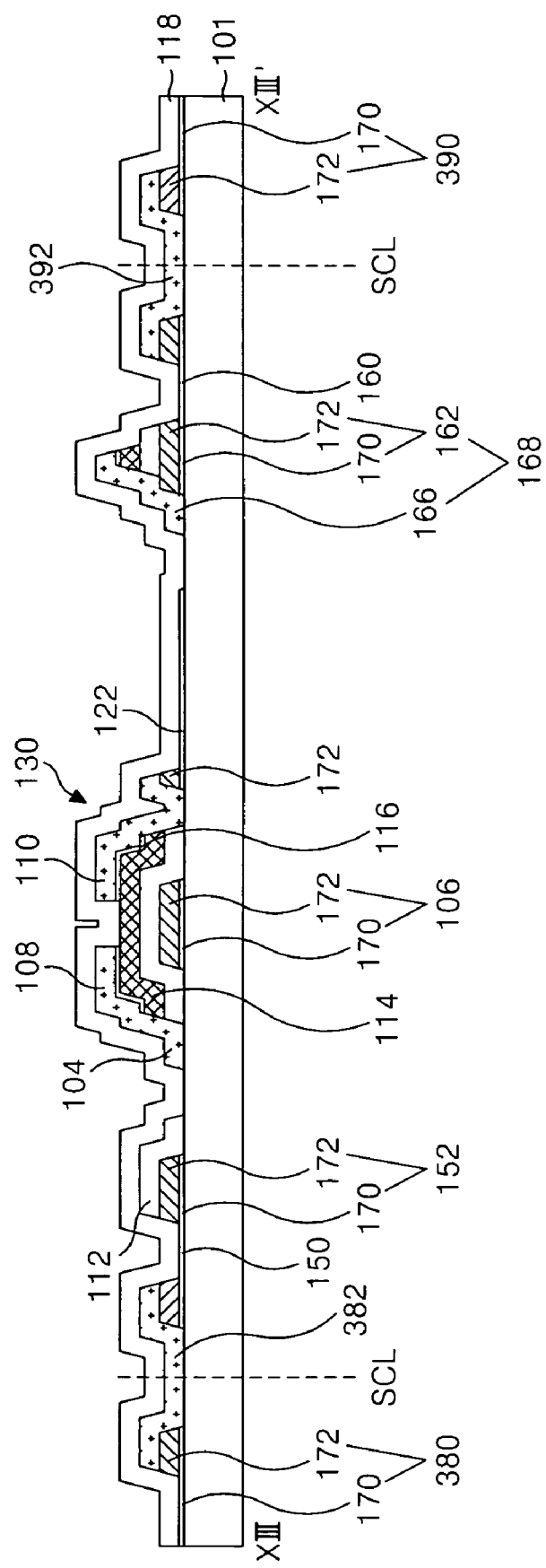
FIG. 13 is a cross-sectional view of the thin film transistor array substrate structure taken along line XIII–XIII' of FIG. 12.

FIG. 12 is a plan view showing a structure of a thin film transistor array substrate structure according to a third embodiment of the present invention, and FIG. 13 is a cross-sectional view of the thin film transistor array substrate structure taken along line XIII-XIII' of FIG. 12. The thin film transistor array substrate structure shown in FIG. 12 and FIG. 13 have similar elements as that of FIG. 5 and FIG. 6 except that the transparent conductive film 170 included in a gate shorting bar 380 and a data shorting bar 390 are exposed. Thus, a detailed explanation of the similar elements will be omitted.

The gate shorting bar 380 is electrically connected to the gate pad 150, via a gate shorting line 382. The gate shorting bar 380 has a structure in that the area forming the gate shorting line 382 is enclosed by the transparent conductive film 170 and the gate metal film 172. Remaining area of the gate shorting bar 380 has the gate metal film 172 removed, thus exposing the transparent conductive film 170. The data shorting bar 390 is electrically connected to the data pad 160 via a data shorting line 392. The data shorting bar 390 has a structure in that the area forming the data shorting line 392 is enclosed by the transparent conductive film 170 and the gate metal film 172. Remaining area of the data shorting bar 390 has the gate metal film 172 removed, thus exposing the transparent conductive film 170. The gate shorting line 382 and the data shorting line 392 are formed from a metal identical to the data line 104, for example, a metal having a strong corrosion resistance such as molybdenum (Mo), chrome (Cr), titanium (Ti), tantalum (Ta) or MoW. The gate shorting line 382 is directly connected to portions of the gate metal film 172 included in each of the gate shorting bar 380 and the gate pad 150. The data shorting line 392 is connected to portions of gate metal film 172 included in each of the data shorting bar 390 and the data pad 160.

As mentioned above, the shorting lines 382 and 392 are formed from a metal having a strong resistance to electro-chemical corrosion. During the scribing process, metal forming the shorting lines 382 and 392 are exposed along the side surface of the lower substrate 101. This prevents a corrosion of the shorting lines 382 and 392 and prevents corrosion of the gate pad 150 and the data pad 160.

Next, a method of fabricating a thin film transistor array substrate structure of the liquid crystal display panel according to the third embodiment will be described below.

Figure 14A:
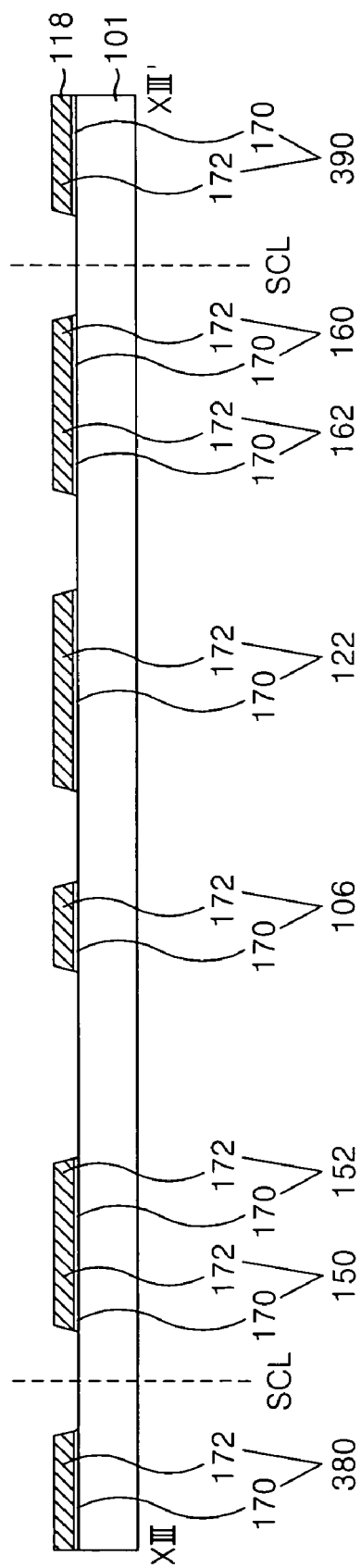
FIG. 14A to FIG. 14C are cross-sectional views for explaining a method of fabricating the thin film transistor array substrate structure of FIG. 10.
Figure 14B:
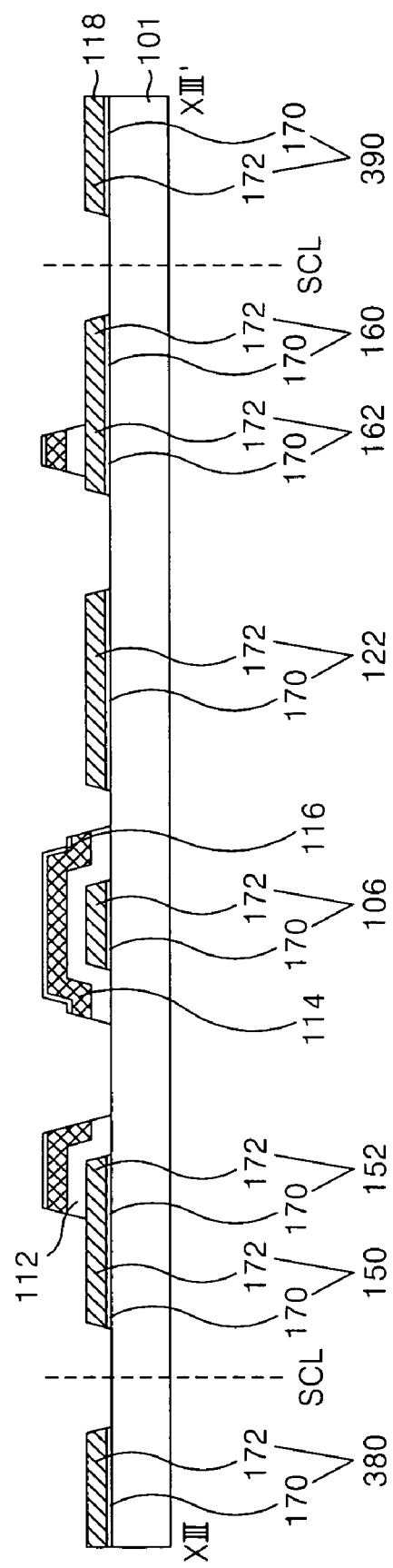
Figure 14C:
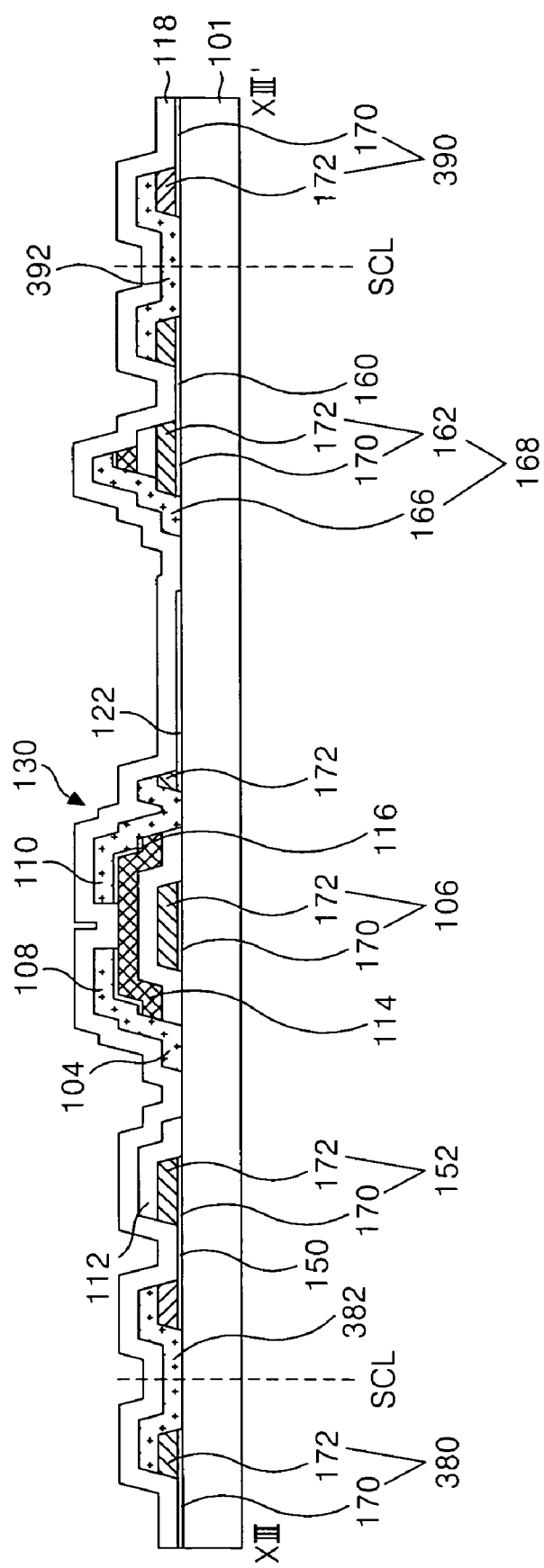

As shown in FIG. 14A, a first conductive pattern group including the gate line 102, the gate electrode 106, the gate shorting bar 380, the gate pad 150, the data shorting bar 390, and the data pad 160; and the pixel electrode 122 including the gate metal film 172 are provided by the first mask process. FIG. 14B shows the gate insulating pattern 112 exposing the gate shorting bar 380, the gate pad 150, the data shorting bar 390, and the data pad 160 by the second mask process. The second mask process also provides the semiconductor pattern which includes active layer 114 and ohmic contact layer 116. In FIG. 14C, a second conductive pattern group including the data line 104, the source electrode 108, the drain electrode 110, the gate shorting line 382 and the data shorting line 392 are provided by the third mask process. The portions of gate metal film 172 included in the pixel electrode 122, the gate shorting bar 380, the gate pad 150, the data shorting bar 390, and the data pad 160 are patterned by utilizing the second conductive pattern as a mask, thereby exposing the transparent conductive film 170 included in them.

Figure 15:
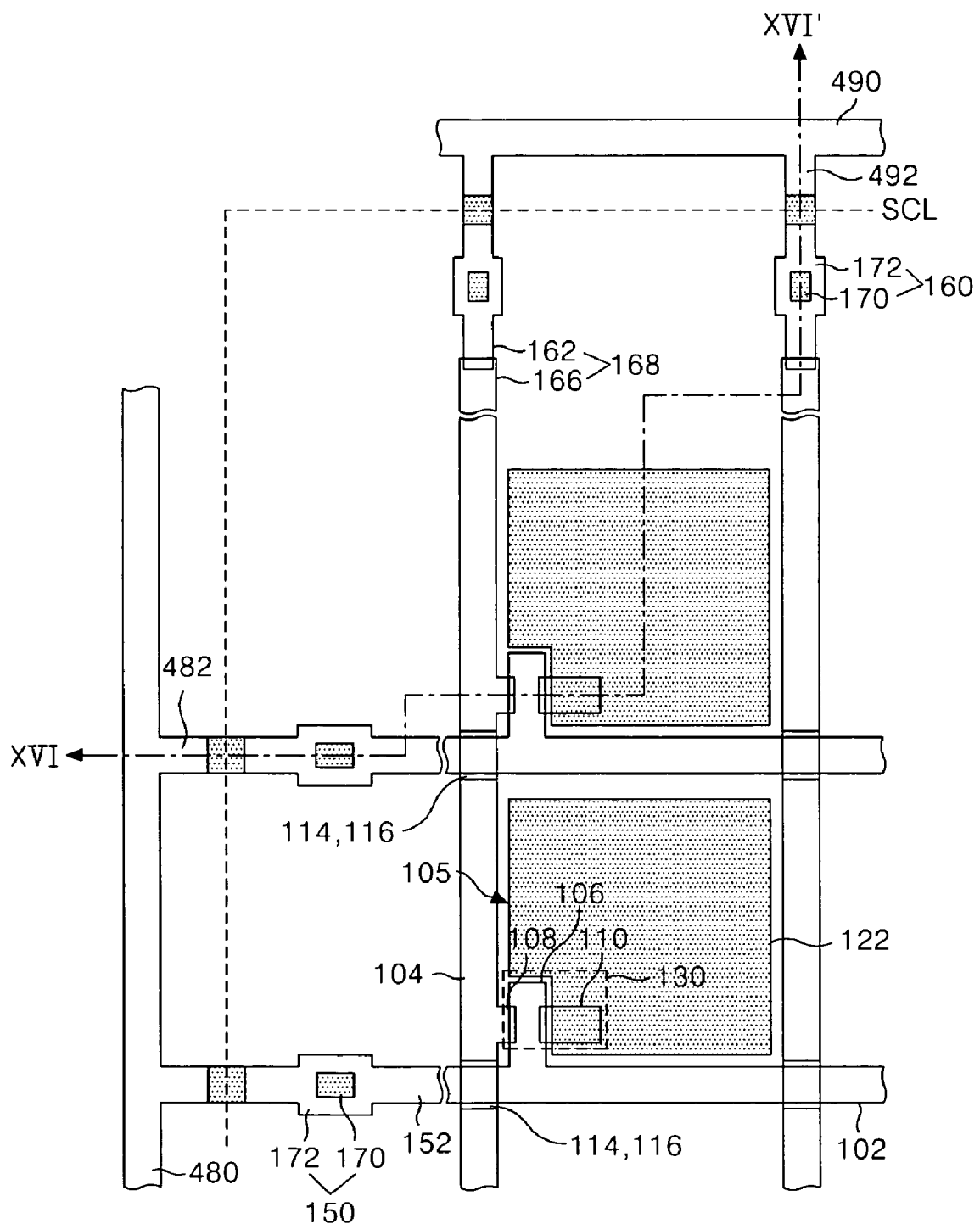
FIG. 15 is a plan view showing a structure of a thin film transistor array substrate structure according to a fourth exemplary embodiment of the present invention.
Figure 16:
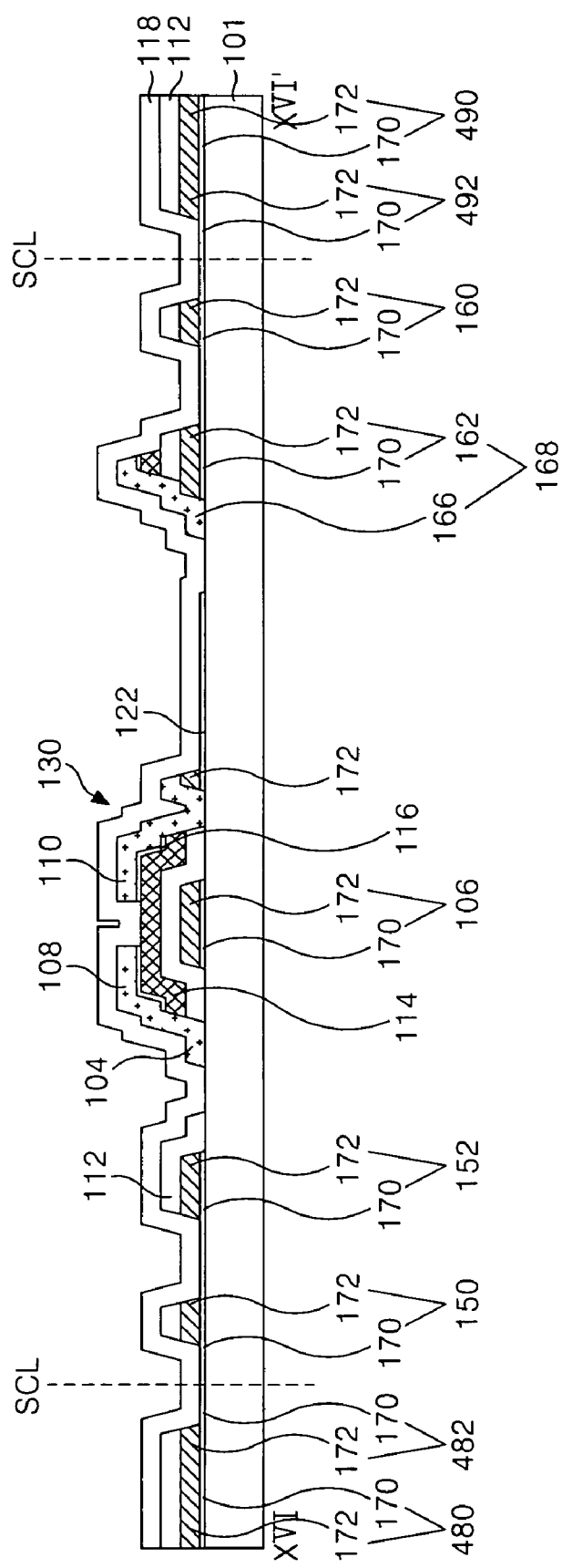
FIG. 16 is a cross-sectional view of the thin film transistor array substrate structure taken along line XVI-XVI' of FIG. 15.

FIG. 15 is a plan view showing a structure of a thin film transistor array substrate structure according to a fourth embodiment of the present invention, and FIG. 16 is a cross-sectional view of the thin film transistor array substrate structure taken along line XVI-XVI' of FIG. 15. The thin film transistor array substrate structure shown in FIG. 15 and FIG. 16 has similar elements as that shown in FIG. 5 and FIG. 6 except that a transparent conductive film of a shorting line is exposed along a scribing line. Thus, a detailed explanation of the similar elements will be omitted.

The gate shorting bar 480 is electrically connected to the gate pad 150 via a gate shorting line 482. The gate shorting bar 480 has a structure in which the area forming the shorting line 482 along the scribing line SCL exposes the transparent conductive film 170. The data shorting bar 490 is electrically connected, via a data shorting line 492, to the data pad 160. The data shorting bar 490 has a structure in that the area forming the data shorting line 492 along the scribing line SCL exposes the transparent conductive film 170.

At least one of the data shorting line 482 and the gate shorting line 492 is comprised of the transparent conductive film 170 and the gate metal film 172 in which the transparent conductive film 170 is partially exposed. In other words, the shorting lines 482 and 492 are provided in such a manner to expose the transparent conductive film 170 at an area corresponding to the scribing line SCL of the lower substrate 101. This aims at preventing the gate metal film 172 from being exposed along the side surface thereof and corrosion of the shorting lines 482 and 492 by the scribing process when the shorting lines 482 and 492 are provided with a gate metal film 172 at area corresponding to the scribing line SCL. The gate metal film 172 formed on the shorting lines 482 and 492 is removed in the scribing process. Accordingly, the transparent conductive film 170 is exposed when the lower substrate 101 is taken along the scribing line SCL, thereby eliminating a risk of corrosion.

Figure 17A:
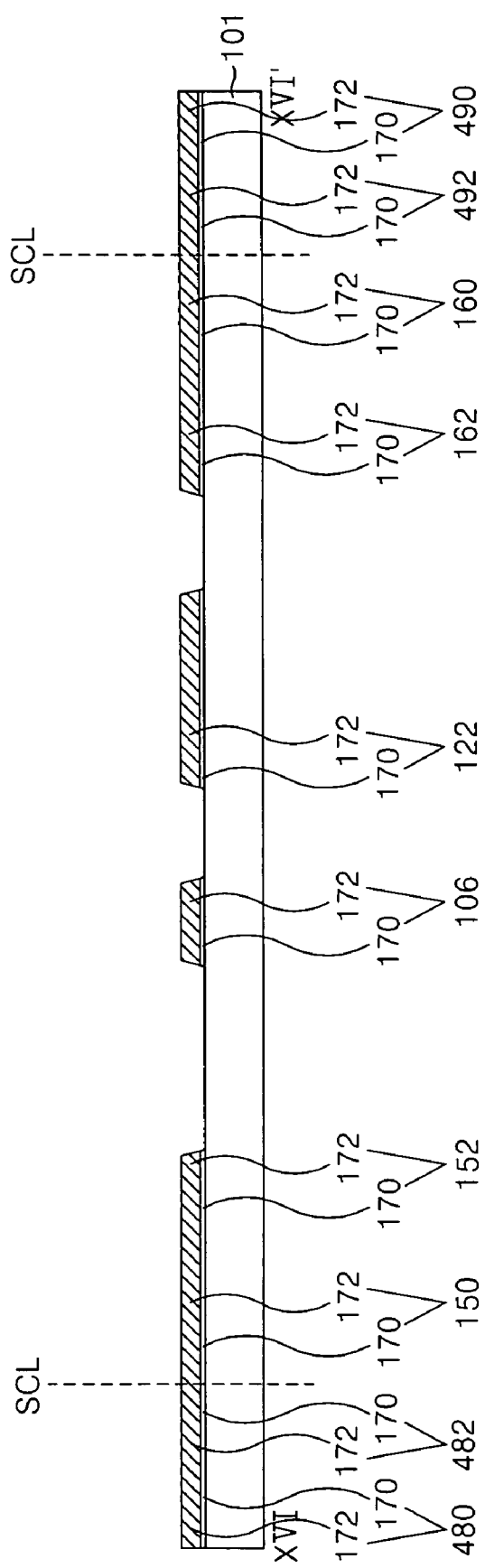
Figure 17C:
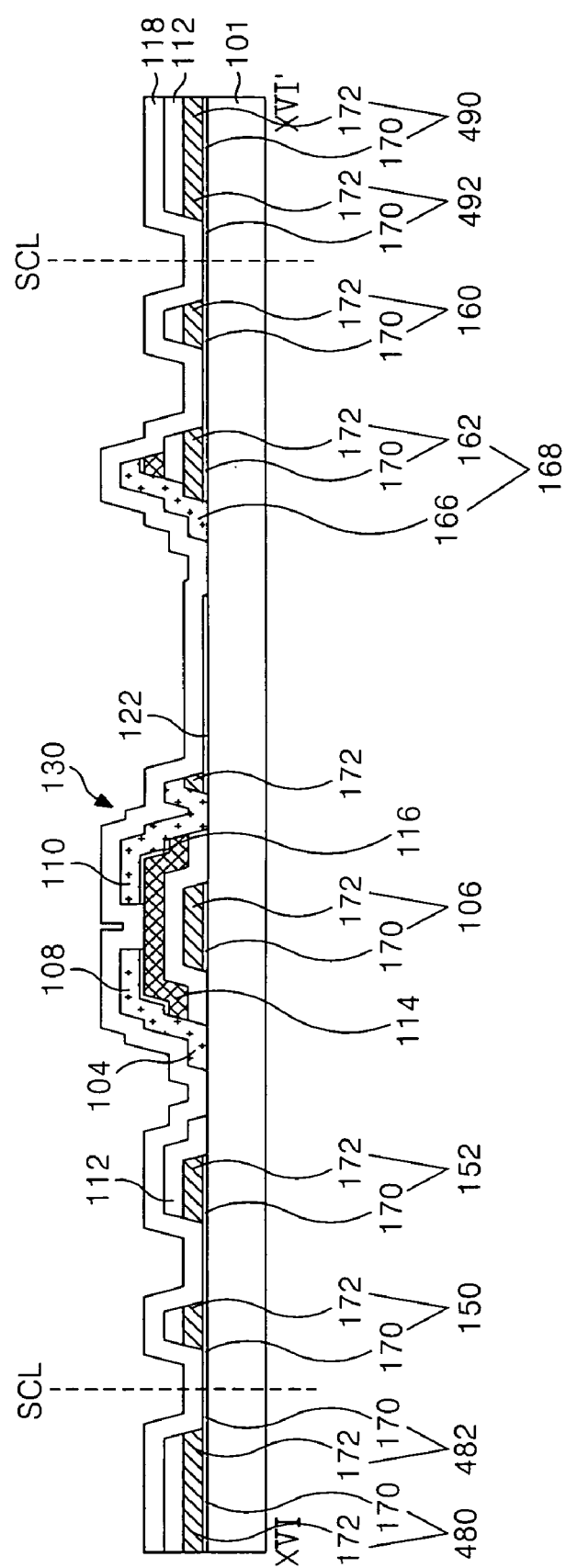

FIG. 17A to FIG. 17C are cross-sectional views taken along line XVI-XVI' of FIG. 15 for explaining a method of fabricating the thin film transistor array substrate structure according to the fourth embodiment of the present invention. Referring to FIG. 17A, the pixel electrode 122; and a first conductive pattern group including the gate line 102, the gate electrode 106, the gate link 152, the gate pad 150, the data pad 160, the lower data link electrode 162, the gate shorting bar 480, the gate shorting line 482, the data shorting bar 490 and the data shorting line 492 are formed on the lower substrate 101 by the first mask process.

More specifically, the transparent conductive film 170 and the gate metal film 172 are sequentially formed on the lower substrate 101 by a deposition technique such as the sputtering. The transparent conductive film 170 is made from a transparent conductive material such as indium-tin-oxide (ITO), tin-oxide (TO), indium-tin-zinc-oxide (ITZO), indium-zinc-oxide (IZO) or the like. The gate metal film 172 is made from a metal such as an aluminum group metal, molybdenum (Mo), copper (Cu) or the like. Then, the transparent conductive film 170 and the gate metal layer 172 are patterned by the photolithography and the etching process using a first mask to provide the pixel electrode 122, and the first conductive pattern group.

Referring to FIG. 17B, a gate insulating pattern 112; and a semiconductor pattern including the active layer 114 and the ohmic contact layer 116 are formed on the lower substrate 101 already provided with the first pattern group by the second mask process. A gate insulating pattern 112, the active layer 114, and the ohmic control layer 116 are sequentially formed on the lower substrate 101 by a deposition technique such as the PEVCD, the sputtering or the like. The gate insulating pattern 112 is formed from an inorganic insulating material such as silicon nitride ($SiN_x$) or silicon oxide ($SiO_x$). The active layer 114 is formed from amorphous silicon not doped with an impurity while the ohmic contact layer 116 is formed from amorphous silicon doped with an N-type or P-type impurity. Then, the gate insulating pattern 112, the active layer 114, and ohmic contact layer 116 are patterned by the etching process using a second mask to provide the gate insulating pattern 112 overlapping the gate line 102, the gate electrode 106, the gate link 152 and the data link 162, and the semiconductor pattern. The semiconductor pattern formed on the gate insulating pattern 112 has a larger width than the first conductive pattern group.

Referring to FIG. 17C, a second conductive pattern group including the data line 104, the source electrode 108, the drain electrode 110 and the upper data link electrode 166 is formed on the lower substrate 101 already provided with the gate insulating pattern 112 and the semiconductor pattern. Further, the gate metal films 172 included in the data pad 160, the gate pad 150, the pixel electrode 122, the gate shorting line 482 and the data shorting line 492 are removed to expose the transparent conductive film 170.

Figure 18A:
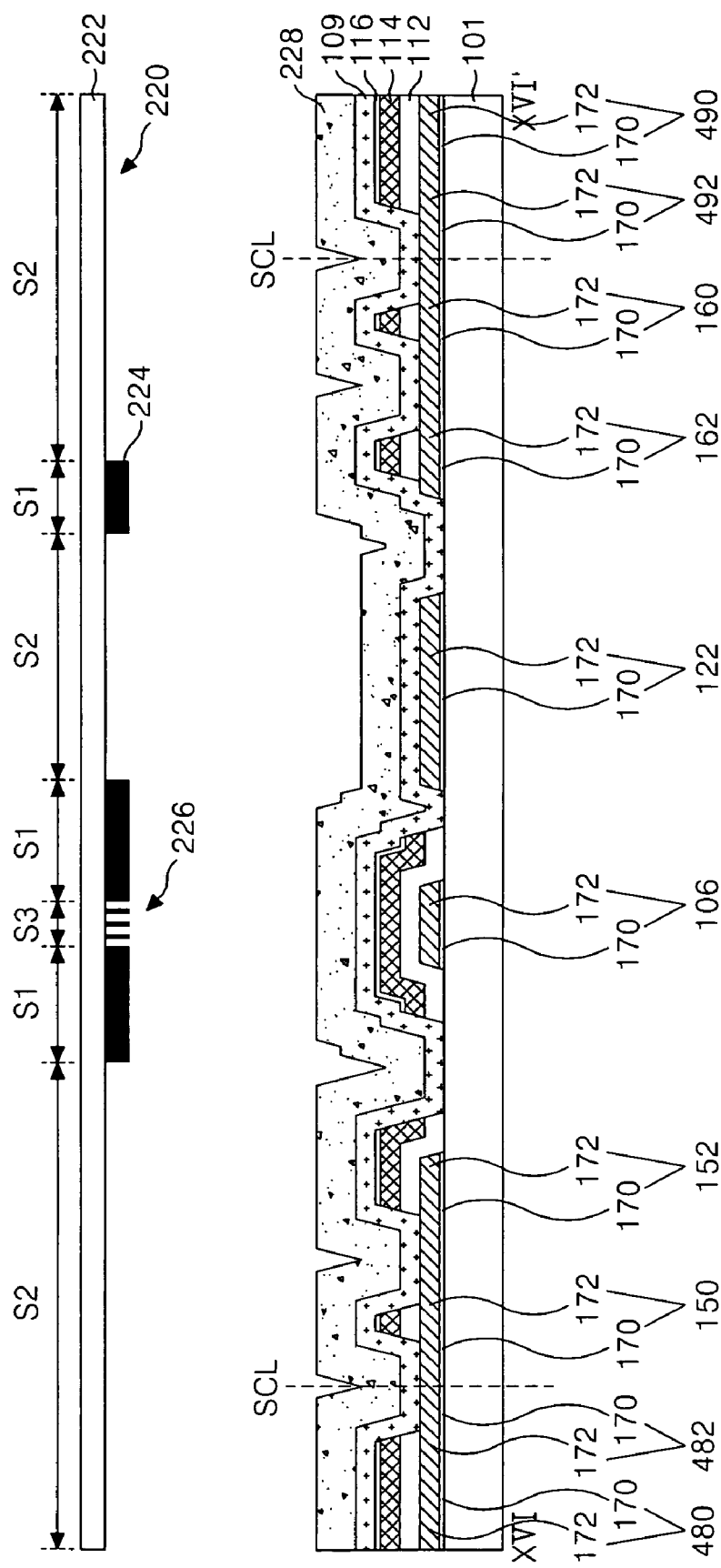

A third mask process according to the fourth embodiment, will be described in detail with reference to FIG. 18A to FIG. 18E below. As shown in FIG. 18A, a data metal layer 109 and a photo-resist film 228 are sequentially formed by a deposition technique such as the sputtering, etc. on the entire lower substrate 101. The data metal layer 109 is formed from a metal such as molybdenum (Mo), copper (Cu) or the like. Then, a third mask 220, that is a partial exposure mask, is aligned at the upper portion of the lower substrate 101. The third mask 220 includes a mask substrate 222 made from a transparent material, a shielding part 224 provided at a shielding area S1 of the mask substrate 222, and a diffractive exposure part (or transflective part) 226 provided at a partial exposure area S3 of the mask substrate 222. The remaining portions of the mask substrate 222 (areas not used as S1 or S3) becomes an exposure area S2.

Figure 18B:
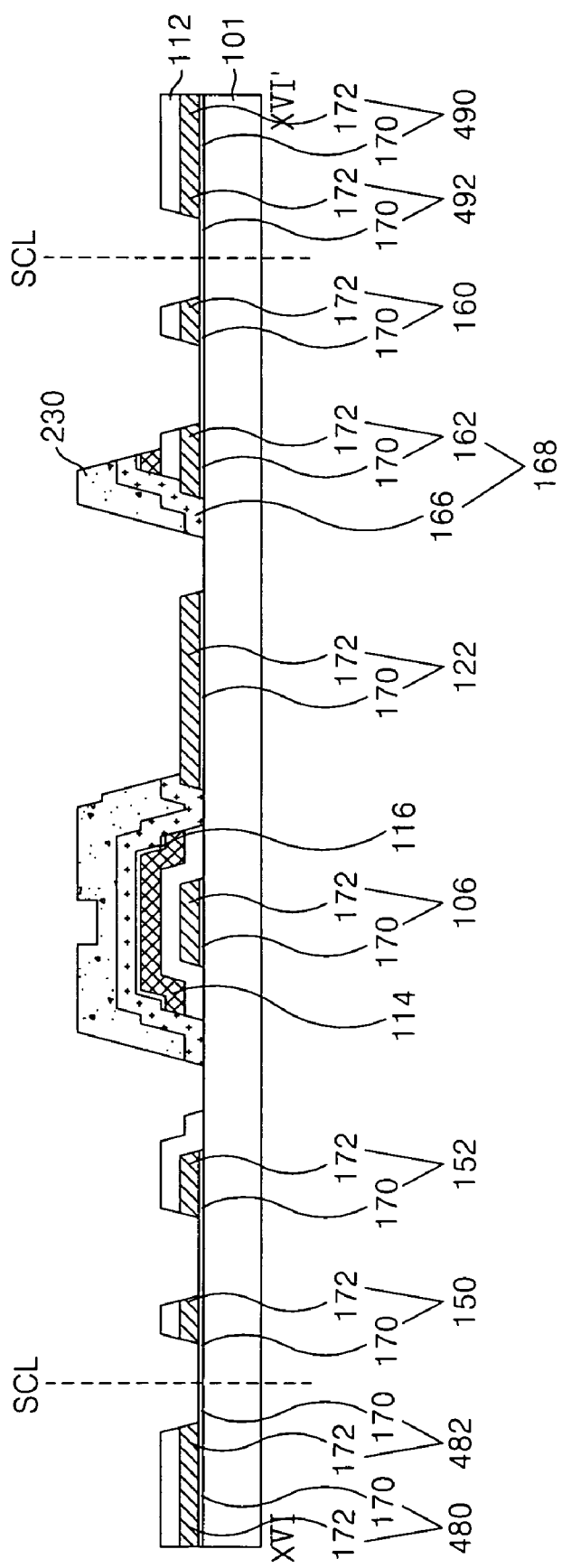

As shown in FIG. 18B, the photo-resist film 228 is removed using the third mask 220 and then developed to provide a photo-resist pattern 230 having step coverage at the shielding area S1 and the partial exposure area S3 in correspondence with the shielding part 224 and the diffractive exposure part 226 of the third mask 220. The photo-resist pattern 230 has a lower height at the partial exposure part S3 than the shielding area S1.

In FIG. 18B, the data metal layer 109 is patterned by the wet etching process using the photo-resist pattern 230 as a mask, to provide a second conductive pattern group. The second conductive pattern group includes the data line 104, the source electrode 108 and the drain electrode 110 connected to one side of the data line 104, and the upper data link electrode 166 connected to the other side of the data line 104. Further, the portions of gate metal film 172 provided in the second conductive pattern group are removed by utilizing the gate insulating pattern 112 as a mask, thereby exposing the transparent conductive films 170 included in the data pad 160, the gate pad 150, the pixel electrode 122, the gate shorting line 482, and the data shorting line 492. Next, the active layer 114 and the ohmic contact layer 116 are formed with respect to the second conductive pattern group by the dry etching using the photo-resist pattern 230 as a mask. At this time, the active layer 114 and the ohmic contact layer 116 disposed at an area other than the second conductive pattern group are removed to prevent a short between the liquid crystal cells caused by the semiconductor pattern including the active layer 114 and the ohmic contact layer 116.

Figure 18D:
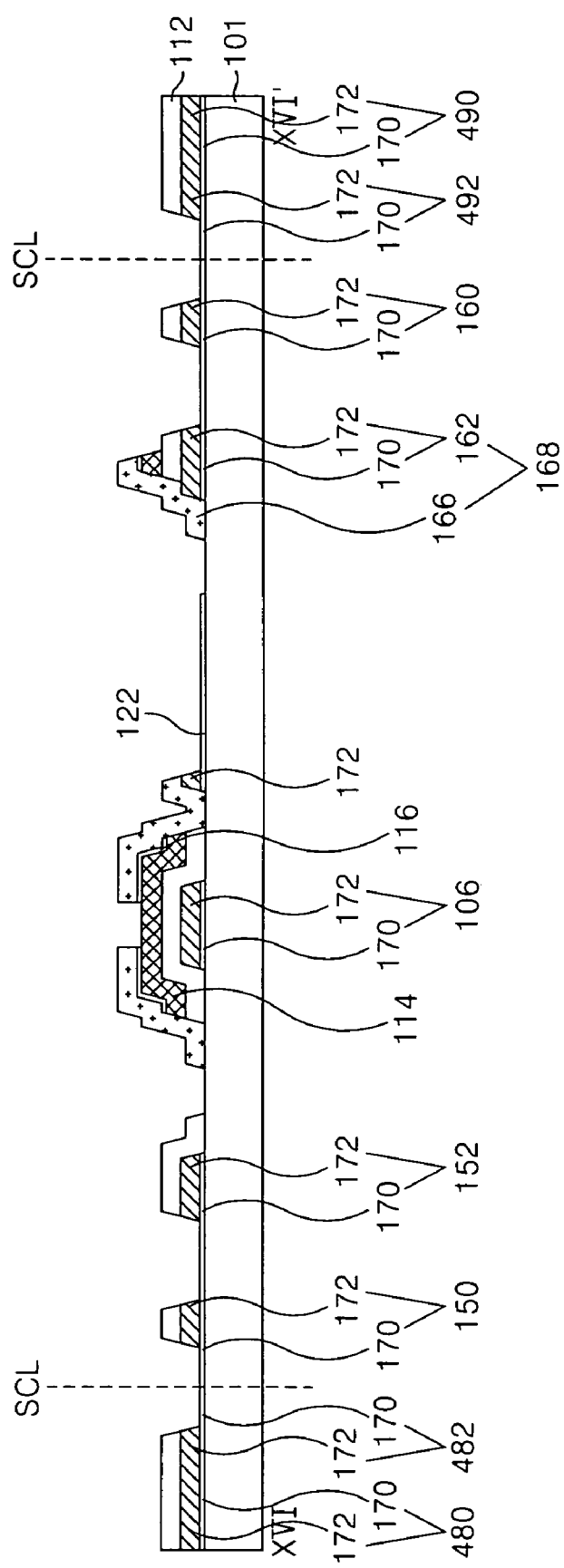

Then, as shown in FIG. 18C, by the ashing process using oxygen (O$_2$) plasma, the photo-resist pattern 230 at the partial exposure area S3 is removed. And, the photo-resist pattern 230 at the shielding area S1 is left with a lower height than an initial height. The data metal layer 109 and the ohmic contact layer 116 provided at the partial exposure area S3, (the channel portion of the thin film transistor) are removed by the etching process using the photo-resist pattern 230, thereby disconnecting the drain electrode 110 from the source electrode 108. Further, as shown in FIG. 18D, the photo-resist pattern 230 left on the second conductive pattern group is removed by the stripping process.

Figure 18E:
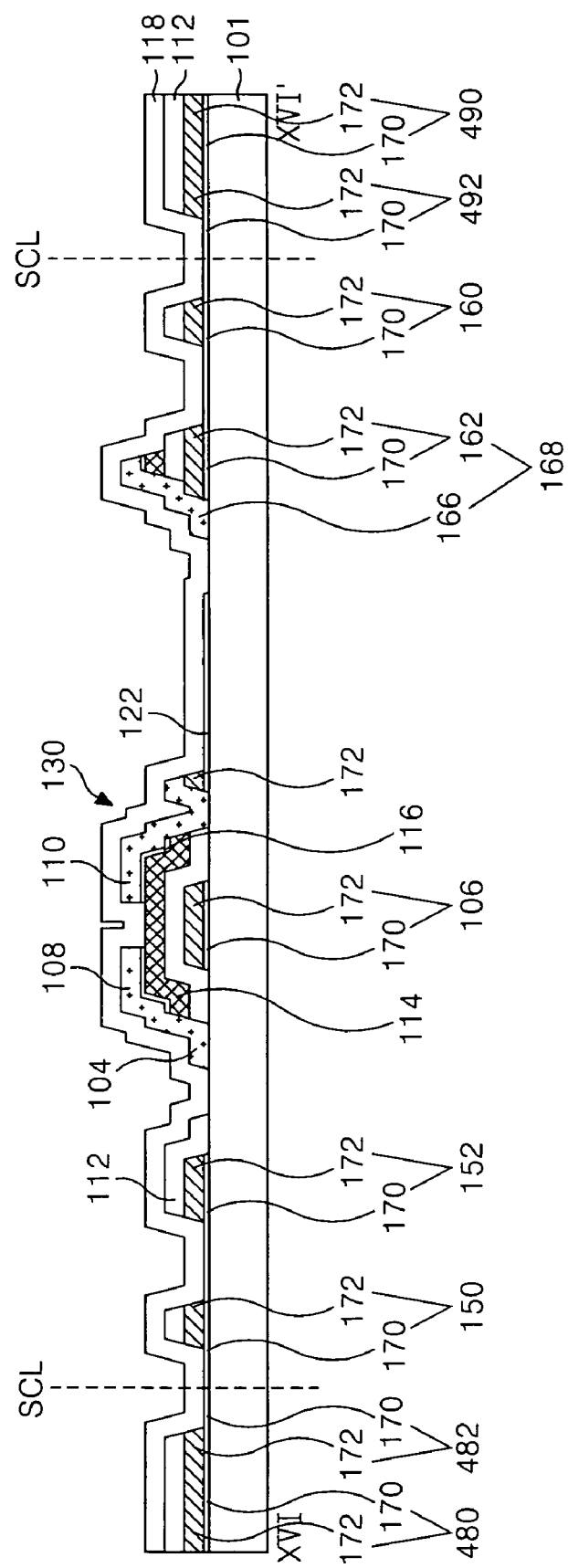

Subsequently, as shown in FIG. 18E, protective film 118 is formed over the entire surface of the substrate 101. The protective film 118 is made from an inorganic insulating material identical to the gate insulating pattern 112, or an organic insulating material such as an acrylic organic compound having a small dielectric constant, BCB (benzocyclobutene) or PFCB (perfluorocyclobutane), etc.

Figure 19:
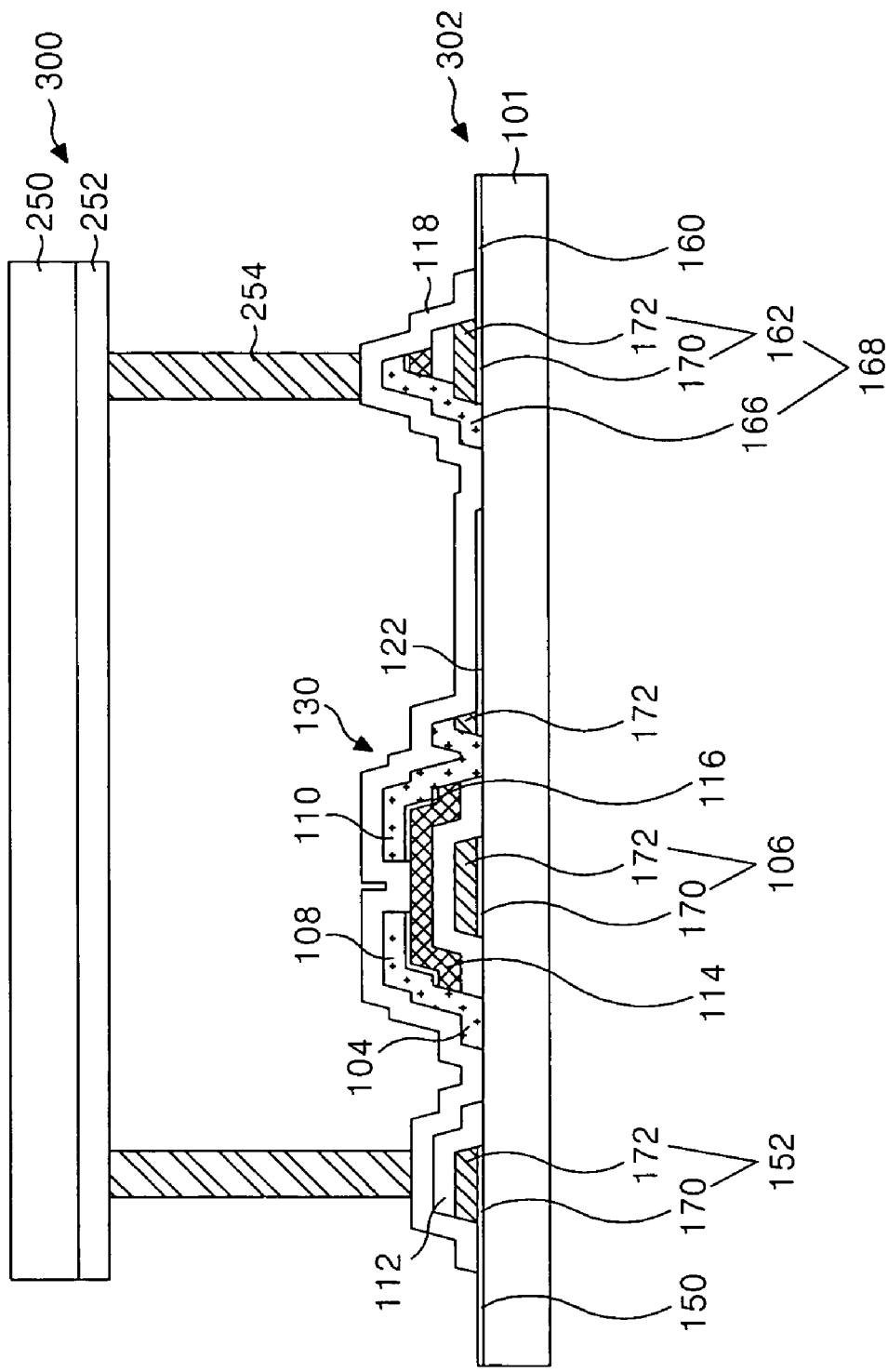
FIG. 19 is a cross-sectional view showing a liquid crystal display panel including the thin film transistor array substrate structure according to a fifth exemplary embodiment of the present invention.

FIG. 19 is a cross-sectional view showing a liquid crystal display panel including the thin film transistor array substrate structure according to a fifth embodiment of the present invention. Referring to FIG. 19, the liquid crystal display panel includes a thin film transistor array substrate structure 302 and a color filter array substrate structure 300 that are joined to each other by a sealant 254. In the color filter array substrate structure 300, a color filter array 252 including black matrices, color filters and common electrodes are provided on an upper substrate 250. The thin film transistor array substrate structure 302 is provided such that an area overlapping the color filter array substrate structure 300 is protected by a protective film 118, whereas portions of the transparent conductive film 170 included in the gate pad 150 and the data pad 160 at a pad area that does not overlap with the color filter array substrate structure 300 are exposed.

A method of fabricating the liquid crystal display panel according to the fifth embodiment will be described below.

Figure 20:
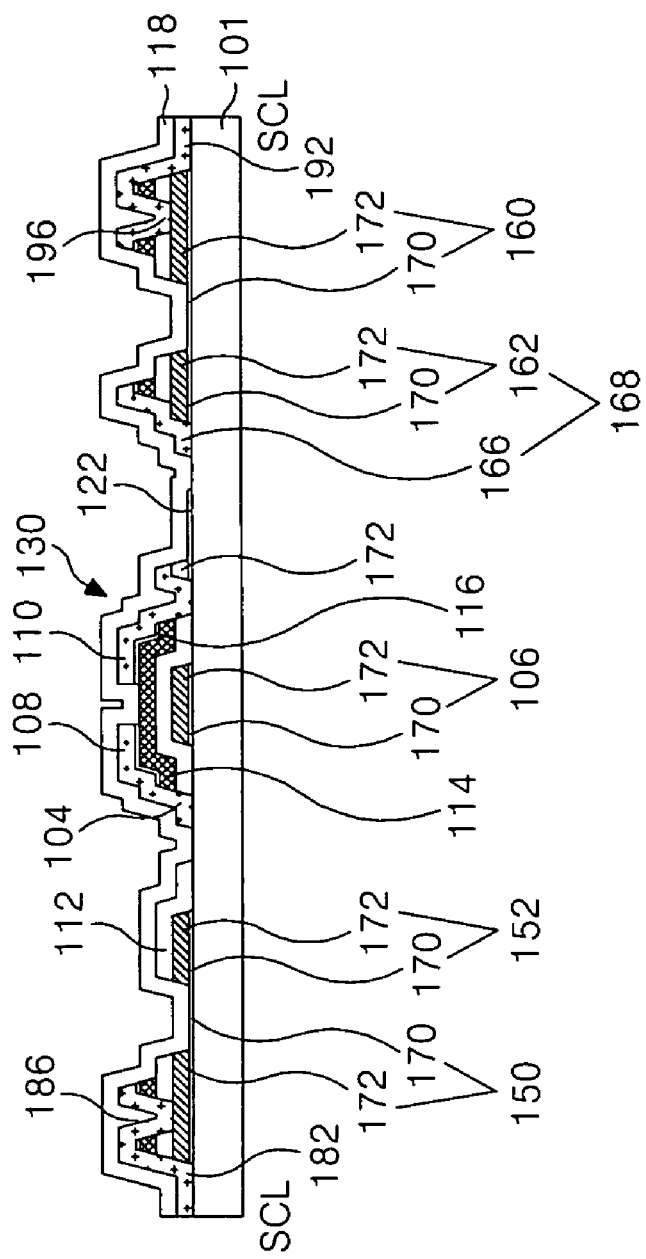
FIG. 20 is a cross-sectional view showing the lower substrate in which the data metal layer according to the present invention is exposed along the side surface thereof.

According to the fifth embodiment, the color filter array substrate structure 300 and the thin film transistor array substrate structure 302 shown in FIG. 19 are prepared separately and thereafter joined to each other by the sealant 254. Then, the protective film 118 of the thin film transistor array substrate structure 302 shown in FIG. 19 is patterned by a pad opening process using the color filter array substrate structure 300 as a mask, thereby providing the transparent conductive films 170 in the gate pad 150 and the data pad 160 at the display area. Subsequently, a non-display area including the gate shorting portion (portion of gate pad 150, gate shorting line 182, shorting contact hole 186) and the data shorting portion (portion of date pad 160, data shoring line 192, shorting contact hole 196) are removed from the scribing line by the scribing process. In FIG. 20, the data metal layer 109 is exposed at scribing line. In FIG. 21, the transparent conductive film 170 is exposed along the side surface of the substrate 101 which has the data metal layer 109 removed along the scribing line SCL, thus preventing corrosion.

FIG. 22 is a cross-sectional view showing other example of a liquid crystal display panel including the thin film transistor array substrate structure according to the fifth embodiments of the present invention. Referring to FIG. 22, the liquid crystal display panel includes an color filter array substrate structure 300 and a thin film transistor array substrate structure 302 that are joined to each other by a sealant 254. In the color filter array substrate structure 300, a color filter array 252 including black matrices, color filters, and common electrodes are provided on an upper substrate 250.

The thin film transistor array substrate structure 302 is provided such that an area defined by an alignment film 256 is protected by a protective film 118 while the transparent conductive films 170 included in the pad area that does not overlap with the alignment film 256 is exposed. In this case, the protective film 118 is patterned by the etching process using the alignment film 256 as a mask. Subsequently, a non-display area including the gate shorting portion (portion of gate pad 150, gate shorting line 182, shorting contact hole 186) and the data shorting portion (portion of date pad 160, data shoring line 192, shorting contact hole 196) are removed from the scribing line by the scribing process. In FIG. 20, the data metal layer 109 is exposed. In FIG. 21, the transparent conductive film 170 is exposed along the side surface of the substrate 101 which has the data metal layer 109 removed along the scribing line SCL, thus preventing corrosion.

Meanwhile, the pad opening process sequentially scans each pad exposed by the color filter array substrate structure 300 using a plasma generated by an atmosphere plasma generator, or collectively scans the color filter array substrate structure 300 for each pad, thereby exposing the transparent conductive films 170 of the gate pad 150 and the data pad 160. Alternatively, a plurality of liquid crystal cells made by joining the color filter array substrate structure 300 with the thin film transistor array substrate structure 302 are introduced as a chamber. Thereafter the protective film 118 at the pad area is exposed by the color filter array substrate structure 300 with the aid of a normal-pressure plasma etching, and furthermore exposing the transparent conductive films 170 of the gate pad 150 and the data pad 160. Otherwise, the entire liquid crystal display panel having the color filter array substrate structure 300 and the thin film transistor array substrate structure 302 joined with each other is immersed into an etching liquid, or the pad area corresponding only to the gate pad 150 and the data pad 160 is immersed into the etching liquid, thereby exposing the transparent conductive films 170 of the gate pad 150 and the data pad 160.

As described above, according to the present invention, the shorting lines provided at an area corresponding to a scribing area (area where the shorting lines crossing the scribing line SCL) are formed from a metal identical to the data line, which has a strong resistance to electro-chemical corrosion. During the scribing process, metal forming the shorting lines are exposed at the scribing area to connect the pad with the shorting bar. In other words, the shorting line is formed from a data metal layer 109 containing molybdenum (Mo), chrome (Cr), titanium (Ti), tantalum (Ta) or MoW, or a transparent conductive material containing ITO or IZO. Accordingly, a metal strong to electro-chemical corrosion is exposed along the side surface of the substrate after the scribing process, thus preventing a corrosion phenomenon of the signal line.

It will be apparent to those skilled in the art that various modifications and variations can be made in the LCD panel and fabricating method thereof of the present invention without departing from the spirit or scope of the invention. Thus, it is intended that the present invention cover the modifications and variations of this invention provided they come within the scope of the appended claims and their equivalents.

What is claimed is:

1. A liquid crystal display panel, comprising:
a thin film transistor array substrate structure including:
a substrate,
a gate line and a data line disposed on the substrate and insulated from each other by a gate insulating pattern therebetween,
a thin film transistor disposed at an intersection of the gate line and the data line,
a protective film disposed to protect the thin film transistor, and
a pad structure connected to a respective one of the gate line and data line,
the pad structure including a transparent conductive film and data metal layer; and
a color filter array substrate structure joined with the thin film transistor array substrate structure,
wherein the protective film is disposed within an area where the color filter array substrate structure overlaps with the thin film transistor array substrate structure so that either the data metal layer or the transparent conductive film is exposed along a side portion of the substrate.

2. The liquid crystal display panel as claimed in claim 1, wherein the pad structure comprises:
a gate pad connected to the gate line and including a transparent conductive film material identical to the material of the gate line; and
a data pad connected to the data line and including a transparent conductive film material identical to the material of the data line.

3. The liquid crystal display panel as claimed in claim 1, wherein the thin film transistor includes:
a gate electrode connected to the gate line;
a source electrode connected to the data line;
a drain electrode disposed opposite to the source electrode; and
a semiconductor pattern overlapping the gate electrode with having the gate insulating pattern therebetween and defining a channel portion between the source electrode and the drain electrode.

4. The liquid crystal display panel as claimed in claim 1, wherein the transparent conductive film includes at least one of TO, ITO, IZO and ITZO.

5. The liquid crystal display panel as claimed in claim 1, wherein the data metal layer includes at least one of molybdenum (Mo), chrome (Cr), titanium (Ti), tantalum (Ta) and MoW.

6. The liquid crystal display panel as claimed in claim 1, further comprising an alignment film formed on the protective film having a same pattern as the protective film.

7. The liquid crystal display panel as claimed in claim 1, further comprising:
a plurality of pads, each of which is connected to a respective one of the gate line and the data line disposed at a display area, the plurality of pads including a transparent conductive film and a gate metal film, wherein a portion of the transparent conductive film along a scribing line of a thin film transistor array substrate structure is exposed.

8. The liquid crystal display panel as claimed in claim 1, wherein the gate line and the gate electrode includes a transparent conductive material and a gate metal film material that are identical to the materials of the pad structure.

9. The liquid crystal display panel as claimed in claim 8, wherein the gate metal film includes at least one of molybdenum (Mo), copper (Cu), tantalum (Ta) and titanium (Ti).

10. A method of fabricating a liquid crystal display panel, comprising the steps of:
forming a first conductive pattern group including a gate line, a gate electrode, a gate pad and a data pad each including a transparent conductive film, and a pixel electrode on a substrate;
forming a semiconductor pattern and a gate insulating pattern on the substrate which is provided with the first conductive pattern group and the pixel electrode;
forming a second conductive pattern group including a data line, a source electrode, and, a drain electrode on the substrate which is provided with the semiconductor pattern and the gate insulating pattern;
forming a thin film transistor by the first conductive pattern group, the semiconductor pattern, gate insulating pattern, and the second conductive pattern group;
providing a protective film on the substrate and the thin film transistor to protect the thin film transistor;
forming an alignment film on the protective film at an area other than a pad area which includes the gate pad and the data pad;
removing the protective film from a portion of the pad area by utilizing the alignment film as a mask to expose the transparent conductive film included in the pad area; and
scribing the substrate along a scribing line where the scribing line crosses a shorting line connected to the data pad and the gate pad,
wherein the shorting line is provided so that at least one of the transparent conductive film and a data metal layer is exposed along a side portion of the substrate during the scribing step.

11. The method as claimed in claim 10, further comprising the step of exposing the portions of transparent conductive film included in the shorting line, the pixel electrode, the gate pad and the data pad using at least one of the second conductive pattern group, the gate insulating pattern and the semiconductor pattern as a mask.

12. The method as claimed in claim 10, wherein the transparent conductive film includes at least one of TO, ITO, IZO and ITZO.

13. The method as claimed in claim 10, wherein the data metal layer includes at least one of molybdenum (Mo), chrome (Cr), titanium (Ti), tantalum (Ta) and MoW.

14. The method as claimed in claim 10, wherein the step of removing the protective film from a portion of the pad area by utilizing the alignment film as a mask to expose the transparent conductive film provided in the pad area includes:
printing the alignment film on the substrate which is provided with the protective film; and
etching the protective film from a portion of the pad area using the alignment film as the mask.

15. The method as claimed in claim 10, further comprising the step of forming a shorting bar connected to the shorting lines.

16. The method as claimed in claim 15, wherein the shorting line is formed continuous with a data metal layer and connected to the shorting bar and either the data pad or the gate pad, wherein a plurality of shorting contact holes passing through the gate insulating pattern and the semiconductor pattern expose the shorting bar, the data pad, and the gate pad.

17. The method as claimed in claim 15, wherein the shorting bar includes a data metal layer material identical to the material of the shorting line.

18. The method as claimed in claim 15, wherein at least one of the shorting bar, the gate line, and the gate electrode includes a transparent conductive material and a gate metal film material that are identical to the materials of the pad structure.

19. The method as claimed in claim 18, wherein the shorting line includes a data metal layer contacting the gate metal film of the data pad, the gate pad, and the shorting bar.

20. The method as claimed in claim 18, wherein the gate metal film includes at least one of molybdenum (Mo), copper (Cu), tantalum (Ta) and titanium (Ti).

21. The method as claimed in claim 10, wherein the shorting line includes a transparent conductive material and a gate metal film material, wherein a portion of the gate metal film is removed along a scribing line of the substrate to expose the transparent conductive film.

22. The method as claimed in claim 21, wherein the gate metal film includes at least one of molybdenum (Mo), copper (Cu), tantalum (Ta) and titanium (Ti).

23. A method of fabricating a liquid crystal display panel, comprising the steps of:
providing a thin film transistor array substrate structure having a gate line and a data line disposed on a substrate and insulated from each other by a gate insulating pattern therebetween, a thin film transistor disposed at an intersection of the gate line and the data line, a pixel electrode connected to the thin film transistor, a protective film disposed to protect the thin film transistor, a pad structure connected to a respective one of the gate line and data line and including a transparent conductive film and a data metal layer;
joining a color filter array substrate structure with the thin film transistor array substrate structure; and
providing a protective film within an area where the color filter array substrate structure overlaps with the thin film transistor array substrate structure so that either the data metal layer or the transparent conductive film is exposed along a side portion of the substrate.

24. The method as claimed in claim 23, wherein the step of exposing the transparent conductive film at the pad area using the color filter array substrate structure as a mask includes:
removing the protective film from the pad area by an etching process using the color filter array substrate structure as a mask.

25. The method as claimed in claim 23, wherein said step of providing the thin film transistor array substrate structure includes:
forming a first conductive pattern group including a gate line, a gate electrode, a gate pad and a data pad each including a transparent conductive film, and a pixel electrode on a substrate;
forming a semiconductor pattern and a gate insulating pattern on the substrate which is provided with the first conductive pattern group and the pixel electrode;
forming a second conductive pattern group including a data line, a source electrode, and a drain electrode on the substrate which is provided with the semiconductor pattern and the gate insulating pattern;
forming a thin film transistor by the first conductive pattern group, the semiconductor pattern, gate insulating pattern, and the second conductive pattern group;
providing a protective film on the substrate and the thin film transistor to protect the thin film transistor;
forming an alignment film on the protective film at an area other than a pad area which includes the gate pad and the data pad;
removing the protective film from a portion of the pad area by utilizing the alignment film as a mask to expose a transparent conductive film included in the pad area; and
scribing the substrate along a scribing line where the scribing line crosses a shorting lines connected to the data pad and the gate pad,
wherein the shorting line is provided so that at least one of the transparent conductive film and the data metal layer is exposed along a side portion of the substrate during the scribing step.

26. The method as claimed in claim 25, wherein the data metal layer includes at least one of molybdenum (Mo), chrome (Cr), titanium (Ti), tantalum (Ta) and MoW.

27. The method as claimed in claim 25, wherein the transparent conductive film includes at least one of TO, ITO, IZO and ITZO.

28. The method as claimed in claim 25, wherein the shorting line includes a transparent conductive material and a gate metal film material, wherein a portion of the gate metal film is removed along a scribing line of the substrate to expose the transparent conductive film.

29. The method as claimed in claim 28, wherein the gate metal film includes at least one of molybdenum (Mo), copper (Cu), tantalum (Ta) and titanium (Ti).

30. The method as claimed in claim 25, further comprising the step of exposing portions of the transparent conductive film included in the shorting line, the pixel electrode, the gate pad and the data pad using at least one of the second conductive pattern group, the gate insulating pattern, and the semiconductor pattern as a mask.

31. The method as claimed in claim 25, further comprising the step of forming a shorting bar connected to the shorting line.

32. The method as claimed in claim 31, wherein the shorting line is formed continuous with a data metal layer and connected to the shorting bar and either the data pad or the gate pad, wherein a plurality of shorting contact holes passing through the gate insulating pattern and the semiconductor pattern expose the shorting bar, the data pad, and the gate pad.

33. The method as claimed in claim 31, wherein the shorting bar includes a data metal layer material identical to the material of the shorting line.

34. The method as claimed in claim 31, wherein at least one of the shorting bar, the gate line, and the gate electrode includes a transparent conductive material and a gate metal film material that are identical to the materials of the pad structure.

35. The method as claimed in claim 34, wherein the shorting line includes a data metal layer contacting the gate metal film of the data pad, the gate pad, and the shorting bar.

36. The method as claimed in claim 34, wherein the gate metal film includes at least one of molybdenum (Mo), copper (Cu), tantalum (Ta) and titanium (Ti).

* * * * *